(12) United States Patent
Iwata et al.

(10) Patent No.: US 7,828,896 B2
(45) Date of Patent: Nov. 9, 2010

(54) METHODS OF GROWING A GROUP III NITRIDE CRYSTAL

(75) Inventors: Hirokazu Iwata, Miyagi (JP); Seiji Sarayama, Miyagi (JP); Hisanori Yamane, Miyagi (JP); Masahiko Shimada, Miyagi (JP); Masato Aoki, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 474 days.

(21) Appl. No.: 11/878,125

(22) Filed: Jul. 20, 2007

(65) Prior Publication Data

US 2007/0266928 A1 Nov. 22, 2007

Related U.S. Application Data

(62) Division of application No. 10/765,502, filed on Jan. 28, 2004, now Pat. No. 7,261,775.

(30) Foreign Application Priority Data

| Jan. 29, 2003 | (JP) | ............................. 2003-019716 |
| Mar. 17, 2003 | (JP) | ............................. 2003-071302 |
| Mar. 25, 2003 | (JP) | ............................. 2003-081836 |
| Jan. 20, 2004 | (JP) | ............................. 2004-011536 |
| Jan. 21, 2004 | (JP) | ............................. 2004-012906 |
| Jan. 21, 2004 | (JP) | ............................. 2004-013562 |

(51) Int. Cl.
*C30B 11/04* (2006.01)

(52) U.S. Cl. .............................. 117/81; 117/82; 117/93; 117/76

(58) Field of Classification Search .................. 117/81, 117/82, 83, 76
See application file for complete search history.

(56) References Cited

U.S. PATENT DOCUMENTS

| 3,933,573 | A | 1/1976 | Dugger |
| 5,665,985 | A | 9/1997 | Iwata |
| 5,684,523 | A | 11/1997 | Satoh et al. |
| 6,270,569 | B1 | 8/2001 | Shibata et al. |
| 6,592,663 | B1 | 7/2003 | Sarayama et al. |
| 6,656,615 | B2 | 12/2003 | Dwilinski et al. |
| 7,001,457 | B2 | 2/2006 | Sarayama et al. |
| 2002/0046695 | A1 | 4/2002 | Sarayama et al. |
| 2002/0175338 | A1 | 11/2002 | Sarayama et al. |
| 2003/0164138 | A1 | 9/2003 | Sarayama et al. |
| 2004/0031437 | A1 | 2/2004 | Sarayama et al. |

FOREIGN PATENT DOCUMENTS

| JP | 60-122797 | 7/1985 |
| JP | 11-60394 | 3/1999 |

(Continued)

OTHER PUBLICATIONS

Japanese Office Actions for 2004-011536.

(Continued)

*Primary Examiner*—Robert M Kunemund
(74) *Attorney, Agent, or Firm*—Dickstein Shapiro LLP

(57) ABSTRACT

A method of growing a group III nitride crystal grows a group III nitride crystal from a solution in which an alkaline metal, a group III metal and nitrogen are dissolved, and includes, in the solution, a material which increases solubility of the nitrogen into the solution.

15 Claims, 19 Drawing Sheets

FOREIGN PATENT DOCUMENTS

| | | |
|---|---|---|
| JP | 2001-58900 | 3/2001 |
| JP | 2001-64097 | 3/2001 |
| JP | 2001-64098 | 3/2001 |
| JP | 2001-102316 | 4/2001 |
| JP | 2001-119103 | 4/2001 |
| JP | 2002-068896 | 3/2002 |
| JP | 2002-128586 | 5/2002 |
| JP | 2002-128587 | 5/2002 |
| JP | 2002-179413 | 6/2002 |
| JP | 2002-647770 | 6/2002 |
| JP | 2002-201100 | 7/2002 |
| JP | 201100 | 7/2002 |
| JP | 2002-326898 | 11/2002 |
| JP | 2003-12400 | 1/2003 |
| JP | 2003-40699 | 2/2009 |
| WO | WO-01/24921 | 4/2001 |
| WO | WO-02/101125 A1 | 12/2002 |

OTHER PUBLICATIONS

Japanese Office Action for 2004-013562.

M. Morishita, et al., "Growth of Bulk GaN Single Crystals Using Li-Na Mixed Flux System," Japan Journal of Applied Physics, Jun. 1, 2003, vol. 42, Pt.2 No. 6A, pp. L656-567.

H. Yamane et al., "Preparation of GaN Single Crystals Using a Na Fluz", Chem. Mater. 1997, vol. 9, pp. 413-416.

H. Yamane et al., "Preparation of GaN Single Crystals Using a Na Fluz", Chem. Mater. 1997, vol. 9, pp. 413-416.

Hisanori, Yamane et al., "Recent Studies on GaN Single Crystal Growth using a Na Flux," Journal of the Japanese Association of Crystal Growth, 2001, vol. 28, No. 5, pp. 316-321.

Aoki, M. et al., "Growth of GaN Single Crystals From Na-Ga Melt and Their Morphology," Preprints of 13th Fall Meeting of the Ceramic Society of Japan, The Ceramic Society of Japan, Oct. 11, 2000, p. 222.

METHODS OF GROWING A GROUP III NITRIDE CRYSTAL

CROSS-REFERENCE TO RELATED APPLICATIONS

This application is a divisional of U.S. patent application Ser. No. 10/765,502, filed on Jan. 28, 2004 now U.S. Pat. No. 7,261,775, the subject matter of which is incorporated in its entirety by reference herein.

BACKGROUND OF THE INVENTION

This application claims the benefit of Japanese Patent Applications No. 2003-019716 filed Jan. 29, 2003, No. 2003-071302 filed Mar. 17, 2003, No. 2003-081836 filed Mar. 25, 2003, No. 2004-011536 filed Jan. 20, 2004, No. 2004-013562 filed Jan. 21, 2004, and No. 2004-012906 filed Jan. 21, 2004, in the Japanese Patent Office, the disclosures of which are hereby incorporated by reference.

The present invention generally relates to methods of growing group III nitride crystals, group III nitride crystals grown thereby, group III nitride crystal growing apparatuses and semiconductor devices, and more particularly to a method of growing a group III nitride crystal which is suited for use in semiconductor devices such as violet light sources which may be used for writing and/or reading information to and/or from optical disks, ultraviolet light sources such as laser diodes and light emitting diodes, violet light sources which may be used for electronic photography, and group III nitride electron devices. The present invention also relates to a group III nitride crystal and a semiconductor device which are produced using the method of growing the group III nitride crystal, and to a group III nitride crystal growing apparatus for growing such a group III nitride crystal.

Existing InGaAlN (group III nitride) devices which are used for violet, blue and green light sources are generally made by using crystal growing methods such as Metal Organic Chemical Vapor Deposition (MO-CVD) and Molecular Beam Epitaxy (MBE) to grow the InGaAlN (group III nitride) crystal on a sapphire or SiC substrate. But when the sapphire or SiC substrate is used, crystal defects increase due to large differences between the coefficient of thermal expansion and the lattice constant of the InGaAlN (group III nitride) crystal and the coefficient of thermal expansion and the lattice constant of the sapphire or SiC substrate. As a result, device performances of the semiconductor devices having the InGaAlN (group III nitride) grown on the sapphire or SiC substrate deteriorate, thereby making it difficult to extend the serviceable life of the light emitting devices, for example, and increasing the power required to operate such semiconductor devices.

Furthermore, in the case of the sapphire substrate which is insulative, it is impossible to draw out the electrodes via the substrate as done in the conventional light emitting devices. Consequently, when the sapphire substrate is used, the electrodes must be drawn out via the group III nitride crystal layer which is grown on the sapphire substrate. As a result, the device area becomes large and it becomes difficult to reduce the cost of such semiconductor devices.

In addition, in the case of the semiconductor device having the group III nitride crystal grown on the sapphire substrate, it is difficult to separate the chips by slicing, and it is not easy to obtain a resonator end surface required by the laser diode by cleavage. For this reason, existing techniques form the resonator end surface by dry etching or, polishes the sapphire substrate to a thickness of 100 μm or less before forming the resonator end surface by a process similar to cleavage. But according to these existing techniques, it is impossible to easily perform the formation of the resonator end surface and the chip separation in a single process as done in conventional laser diodes. Accordingly, these existing techniques require complex processes and increase the cost of the semiconductor devices.

In order to solve the problems described above, a technique was proposed to reduce the crystal defects by taking measures such as selectively growing the group III nitride crystal in a lateral direction on the sapphire substrate. According to this proposed technique, it is possible to reduce the crystal defects compared to a case where a GaN layer is not selectively grown in the lateral direction on the sapphire substrate. However, the above described problems associated with the insulation and the cleavage caused by the use of the sapphire substrate still exist. Furthermore, this proposed technique requires complex processes, and the sapphire substrate warps due to the growing of the GaN layer on the sapphire substrate since sapphire and GaN have different properties. As a result, the cost of the semiconductor device becomes high when this proposed technique is employed to make the semiconductor device.

In order to solve these problems, it is desirable to grow on the substrate a layer which is made of the same material as the substrate. In the case described above, it is desirable to grow the GaN layer on a GaN substrate. Hence, research is being made to grow the crystal of bulk GaN by vapor phase deposition, solution growth and the like. However, a GaN substrate having a practical size and a high quality has yet to be realized.

One method of realizing the GaN substrate is proposed in H. Yamane et al., "Preparation of GaN Single Crystals Using a Na Flux", Chem. Mater. 1997, Vol. 9, pp. 413-416. This proposed method grows the GaN crystal using Na as flux. More particularly, this proposed method uses $NaN_3$ and Ga as raw materials, and seals the raw materials in a nitrogen atmosphere within a stainless steel reaction chamber which has an internal diameter of 7.5 mm and a length of 100 mm, for example. The GaN crystal is grown by maintaining the reaction chamber at a temperature of 600° C. to 800° C. for 24 hours to 100 hours.

In the case of the proposed method according to H. Yamane et al., the Ga crystal can be grown at a relatively low temperature of 600° C. to 800° C. In addition, the pressure within the reaction chamber is on the order of approximately 100 $kg/cm^2$ and is relatively low. Hence, the growth condition of this proposed method is practical.

However, the problem with this proposed method is that the size of the obtained crystal is on the order of approximately 1 mm or less and small. In other words, the reaction chamber used in H. Yamane et al. is a completely closed system, and the raw materials cannot be supplied from outside the reaction chamber. For this reason, the raw materials are depleted during the crystal growth and the crystal growth stops, thereby making the size of the obtained crystal on the order of approximately 1 mm and small. From the practical point of view, the crystal having such a small size is unsuited for making the semiconductor device.

In view of the above, first and second methods were respectively proposed in Japanese Laid-Open Patent Applications No. 2001-58900 and No. 2001-102316.

FIG. 1 is a cross sectional view showing a crystal growing apparatus used by the first method. As shown in FIG. 1, a growth chamber 102 and a group III metal supply pipe 103 are provided within a reaction chamber 101. External pressure is applied to the group III metal supply pipe 103 from outside the reaction chamber 101, so as to additionally supply a group III metal 104 to the reaction chamber 102 which contains flux. In other words, in order to increase the size of the group III nitride crystal which is obtained, the first method additionally supplies the group III metal 104 when growing the group III nitride crystal.

The group III metal supply pipe 103 has a hole 105. The crystal growing apparatus further includes a pressure applying unit 106, an internal space 107 of the reaction chamber 101, a nitrogen supply pipe 108, a pressure control unit 109, a lower heater 110, and a side heater 111.

On the other hand, the second method may be categorized into a mixing method and a fusion method. The mixing method applies external pressure to a molten mixture supply pipe which contains a molten mixture of flux (Na) and group III metal (Ga), so as to additionally supply the molten mixture to a growth chamber which contains the flux. The fusion method supplies an intermetallic compound of flux (Na) and group III metal (Ga), and additionally supplies the group III metal by partial fusion of the intermetallic compound.

According to the first and second methods described above, the raw materials are additionally supplied during the crystal growth, thereby making it possible to grow larger crystals.

However, according to the first method, vapor of the flux (Na) concentrates at a low-temperature portion, causing the flux (Na) to adhere on the group III metal supply pipe 103 which has a low temperature. As a result, the hole 105 of the group III metal supply pipe 103 may be clogged by the adhered flux (Na). If the temperature of the group III metal supply pipe 103 is increased in order to prevent the flux (Na) from adhering thereon, the group III metal reacts with the material forming the group III metal supply pipe 103 in a case where the group III metal is Ga and the material forming the group III metal supply pipe 103 is stainless steel, for example. Consequently, the hole 105 of the group III metal supply pipe 103 is also clogged when such a reaction occurs between the group III metal and the material forming the group III metal supply pipe 103.

On the other hand, according to the mixing method of the second method, the flux exists within the molten mixture supply pipe. For this reason, the group III metal and the nitrogen react within the molten mixture supply pipe and generate a group III nitride, to thereby clog the molten mixture supply pipe.

According to the fusion method of the second method, if the intermetallic compound is mixed into the flux and partially fused, a rapid reaction occurs between the intermetallic compound and the nitrogen, to thereby deteriorate the crystal properties of the group III nitride which is obtained.

And, according to the mixing and fusion methods of the second method, the solubility of the nitrogen to the molten mixture is small, and the growth rate of the group III nitride crystal is low.

SUMMARY OF THE INVENTION

Accordingly, it is a general object of the present invention to provide a novel and useful method of growing a group III nitride crystal, group III nitride crystal grown thereby, a group III nitride crystal growing apparatus and semiconductor device, in which the problems described above are eliminated.

Another and more specific object of the present invention is to provide a method of growing a group III nitride crystal, capable of growing a high-quality group III nitride crystal having a practically large size, a group III nitride crystal grown thereby, a group III nitride crystal growing apparatus, and a semiconductor device which includes a layer of such a group III nitride crystal.

Still another and more specific object of the present invention is to provide a method of growing a group III nitride crystal, comprising growing a group III nitride crystal from a solution in which an alkaline metal, a group III metal and nitrogen are dissolved; and including, in the solution, a material which increases solubility of the nitrogen into the solution.

Another object of the present invention is to provide a method of growing a group III nitride crystal, comprising preparing, as a solvent, a solution which includes an alkaline metal; and growing a group III nitride crystal by fusing a group III nitride into the solution and recrystallizing the group III nitride.

A further object of the present invention is to provide a group III nitride crystal grown by a process comprising growing a group III nitride crystal from a solution in which an alkaline metal, a group III metal and nitrogen are dissolved; and including, in the solution, a material which increases solubility of the nitrogen into the solution, wherein the group III nitride crystal is plate-shaped or columnar.

Another object of the present invention is to provide a group III nitride crystal growing apparatus comprising a reaction chamber; and a solution container, provided within the reaction chamber, to contain a solution in which an alkaline metal, a group III metal and nitrogen are dissolved, the solution including a material which increases solubility of the nitrogen into the solution, whereby a group III nitride crystal is grown in the solution within the solution container.

Still another object of the present invention is to provide a method of growing a group III nitride crystal, comprising growing a group III nitride crystal from a solution in which an alkaline metal, a group III metal and nitrogen are dissolved; and including, in the solution, a material which controls a ratio of a growth rate of the group III nitride crystal in a first direction approximately parallel to a c-axis thereof and a growth rate of the group III nitride crystal in a second direction approximately perpendicular to the c-axis direction thereof.

A further object of the present invention is to provide a method of growing a group III nitride crystal, comprising growing a group III nitride crystal from a solution in which an alkaline metal, a group III metal and nitrogen are dissolved; and including, in the solution, Li which controls a ratio of a growth rate of the group III nitride crystal in a first direction approximately parallel to a c-axis thereof and a growth rate of the group III nitride crystal in a second direction approximately perpendicular to the c-axis direction thereof.

Another object of the present invention is to provide a group III nitride crystal grown by a process comprising growing a group III nitride crystal from a solution in which an alkaline metal, a group III metal and nitrogen are dissolved; and including, in the solution, a material which controls a ratio of a growth rate of the group III nitride crystal in a first direction approximately parallel to a c-axis thereof and a growth rate of the group III nitride crystal in a second direction approximately perpendicular to the c-axis direction thereof, wherein the group III nitride crystal is plate-shaped or columnar depending on the material.

Still another object of the present invention is to provide a group III nitride crystal growing apparatus comprising a reaction chamber; and a solution container, provided within the reaction chamber, to contain a solution in which an alkaline metal, a group III metal and nitrogen are dissolved, the solution including a material which controls a ratio of a growth rate of the group III nitride crystal in a first direction approximately parallel to a c-axis thereof and a growth rate of the group III nitride crystal in a second direction approximately perpendicular to the c-axis direction thereof, whereby a group III nitride crystal is grown in the solution within the solution container.

A further object of the present invention is to provide a method of growing a group III nitride crystal, comprising fusing a group III nitride into a solution including an alkaline metal; and recrystallizing a group III nitride crystal at a location different from a location where the group III nitride is dissolved within the solution.

Another object of the present invention is to provide a group III nitride crystal grown by a process comprising fusing a group III nitride into a solution including an alkaline metal; and recrystallizing a group III nitride crystal at a location different from a location where the group III nitride is dissolved within the solution.

Still another object of the present invention is to provide a group III nitride crystal growing apparatus, comprising a reaction chamber; and a solution container, provided in the reaction chamber, to contain a group III nitride which is dissolved into a solution including an alkaline metal, whereby a group III nitride crystal is recrystallized at a location within the solution chamber different from a location where the group III nitride is dissolved within the solution.

A further object of the present invention is to provide a method of growing a group III nitride crystal, comprising forming, within a reaction chamber, a molten mixture of an alkaline metal and a material which includes a group III metal; growing a group III nitride crystal which is made of the group III metal and nitrogen, from the molten mixture and a material which includes the nitrogen; and controlling a temperature in a vicinity of a surface of the molten mixture and a temperature of a crystal growing region within the molten mixture, so that the nitrogen dissolves into the molten mixture from the surface and the group III nitride crystal grows in the crystal growing region which is other than the surface.

Another object of the present invention is to provide a group III nitride crystal grown by a process comprising forming, within a reaction chamber, a molten mixture of an alkaline metal and a material which includes a group III metal; growing a group III nitride crystal which is made of the group III metal and nitrogen, from the molten mixture and a material which includes the nitrogen; and controlling a temperature in a vicinity of a surface of the molten mixture and a temperature of a crystal growing region within the molten mixture, so that the nitrogen dissolves into the molten mixture from the surface and the group III nitride crystal grows in the crystal growing region which is other than the surface.

Still another object of the present invention is to provide a group III nitride crystal growing apparatus comprising a reaction chamber; a solution container, provided within the reaction chamber, to contain a molten mixture of an alkaline metal and a material which includes a group III metal, so that a group III nitride crystal which is made of the group III metal and nitrogen is grown from the molten mixture and a material which includes the nitrogen; and means for controlling a temperature in a vicinity of a surface of the molten mixture and a temperature of a crystal growing region within the molten mixture, so that the nitrogen dissolves into the molten mixture from the surface and the group III nitride crystal grows in the crystal growing region which is other than the surface.

A further object of the present invention is to provide a semiconductor device comprising a substrate made of a group III nitride; and a stacked structure provided on the substrate, where the stacked structure is selected from a group consisting of a light emitting structure, a light receiving structure and a transistor structure, and the substrate is made by any of the above described methods of growing a group III nitride crystal.

Other objects and further features of the present invention will be apparent from the following detailed description when read in conjunction with the accompanying drawings.

DESCRIPTION OF THE PREFERRED EMBODIMENTS

A description will be given of various embodiments of a method of growing a group III nitride crystal, a group III nitride crystal grown thereby, a group III nitride crystal growing apparatus, and a semiconductor device, according to the present invention, by referring to FIG. 2 and the subsequent figures.

First Embodiment

According to a first embodiment, Na is used as an alkaline metal, and Ga is used as a group III metal raw material. Nitrogen gas is used as nitrogen raw material, and Li is added using $Li_3N$ as a raw material, to grow GaN crystals as a group III nitride.

The Na, Ga and $Li_3N$ may be prepared in advance as a molten mixture within a solution container, and the nitrogen may be supplied during the crystal growth by fusion from a vapor phase into the molten mixture, to grow the GaN crystals.

Figure 1:
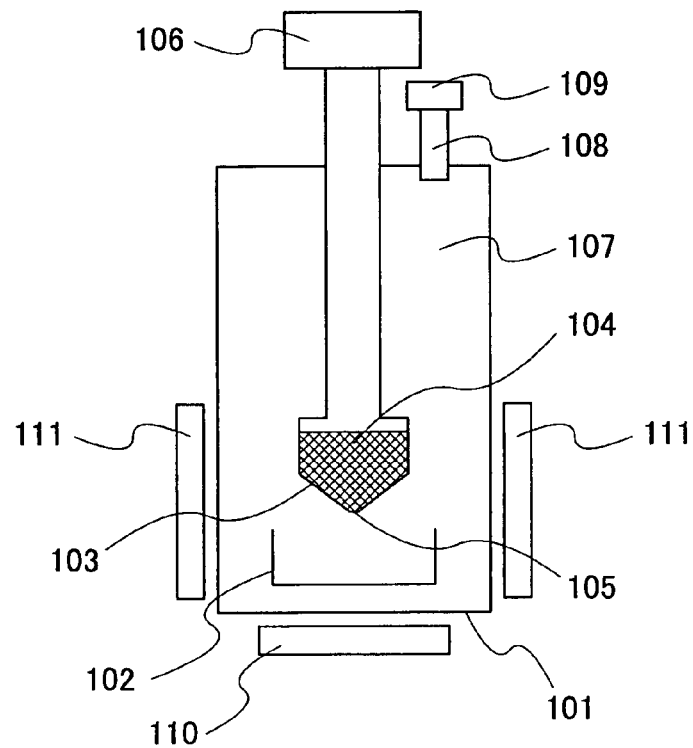
FIG. 1 is a cross sectional view showing a crystal growing apparatus used by a first method.
Figure 2:
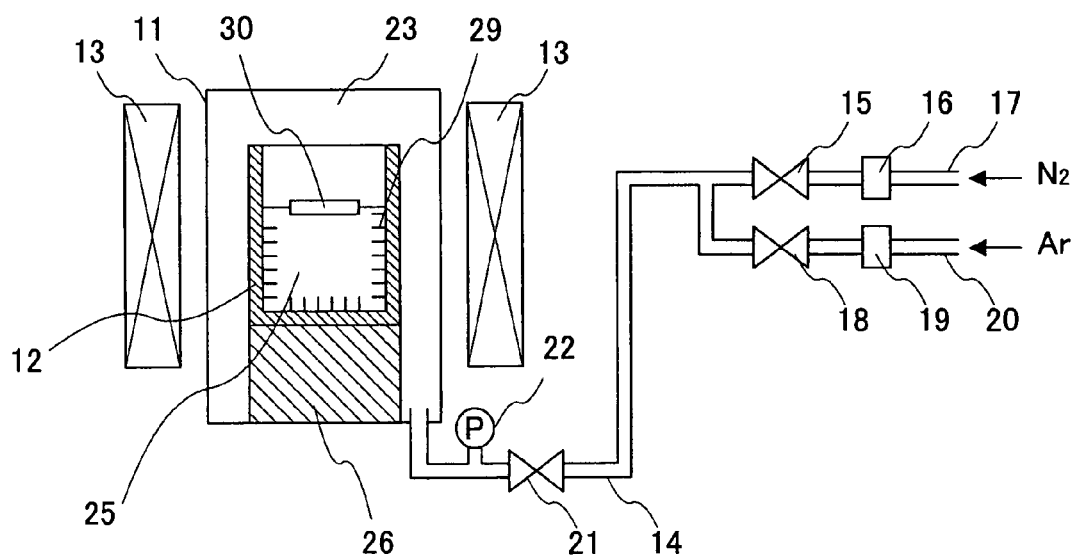
FIG. 2 is a cross sectional view showing a first embodiment of a group III nitride crystal growing apparatus according to the present invention.
Figure 3:
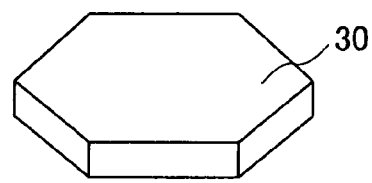
FIG. 3 is a perspective view showing a plate-shaped GaN crystal which is obtained by growing a GaN crystal by the group III nitride crystal growing apparatus shown in FIG. 2.

FIG. 2 is a cross sectional view showing a first embodiment of the group III nitride crystal growing apparatus, and FIG. 3 is a perspective view showing a plate-shaped GaN crystal, that is, a first embodiment of the group III nitride crystal, which is obtained by growing the GaN crystal by the group III nitride crystal growing apparatus shown in FIG. 2.

The group III nitride crystal growing apparatus shown in FIG. 2 includes a reaction chamber 11 which accommodates a solution container 12. The reaction chamber 11 is made of stainless steel and has a closed shape. A solution 25 including the alkaline metal and the group III metal is contained within the solution container 12. The solution container 12 is placed on a holder 26, and contains the solution 25 which is required for the crystal growth of the GaN.

The solution container 12 may be removed from the reaction chamber 11. In this embodiment, the solution container 12 is made of BN.

A gas supply pipe 14 connects to the reaction chamber 11. The gas supply pipe 14 supplies nitrogen ($N_2$) gas to an internal space 23 within the reaction chamber 11, as the nitrogen raw material, and enables adjustment of the nitrogen ($N_2$) gas pressure within the reaction chamber 11 from a pressure control unit 16 which connects to a $N_2$ gas supply pipe 17.

The gas supply pipe 14 branches via a valve 18 so that Ar gas may be introduced. The Ar gas pressure may be adjusted from a pressure control unit 19 which connects to an Ar gas supply pipe 20.

The total pressure within the reaction chamber 11 is monitored by a pressure gage 22. A heater 13 is arranged on an outer side of the reaction chamber 11. Valves 15 and 21 are provided in the gas supply pipe 14. The reaction chamber 11 may be removed from the group III nitride crystal growing apparatus at the valve 21, so that only the reaction chamber 11 may be placed into a glove box and worked on by an operator.

Next, a description will be given of a first embodiment of the method of growing the group III nitride crystal according to the present invention, which grows GaN, by the group III nitride crystal growing apparatus shown in FIG. 2.

First, the reaction chamber 11 is separated from the group III nitride crystal growing apparatus at the valve 21, and placed into a glove box (not shown) having an Ar atmosphere.

Then, Ga is supplied as the group III metal raw material and Na is supplied as the alkaline metal, into the solution container 12 which is made of BN. A proportion of Na in the solution 25 is set to $Na/(Na+Ga)=0.7$.

In addition, $Li_3N$ is supplied as the Li raw material, into the solution container 12.

Next, the solution container 12 is placed on the holder 26 and set within the reaction chamber 11. The reaction chamber 11 is sealed, the valve 21 is closed, and the inside of the reaction chamber 11 is shut off from the external atmosphere. The reaction chamber 11 is then removed from the glove box, and assembled into the group III nitride crystal growing apparatus. In other words, the reaction chamber 11 is set at a predetermined position of the group III nitride crystal growing apparatus where the heater 13 is provided, and is connected to the gas supply pipe 14 at the valve 21 so that the reaction chamber 11 may receive the $N_2$ and Ar gases.

The valves 15 and 21 are then opened, to supply the $N_2$ gas into the reaction chamber 11. In this state, the $N_2$ gas pressure is set to 3.3 MPa by the pressure control unit 16. In this embodiment, this $N_2$ gas pressure of 3.3 MPa causes the total pressure within the reaction chamber 11 to become 4 MPa when the temperature within the reaction chamber 11 rises to a crystal growth temperature of 775° C., for example.

Then, the valve 15 is closed, and the valve 18 is opened, to supply the Ar gas into the reaction chamber 11. In this state, the Ar gas pressure is set to 6.6 MPa by the pressure control unit 19. In other words, the Ar partial pressure within the reaction chamber 11 becomes 3.3 MPa. In this embodiment, this Ar gas pressure of 6.6 MPa causes the total pressure within the reaction chamber 11 to become 8 MPa when the temperature within the reaction chamber 11 rises to a crystal growth temperature of 775° C., for example. That is, this Ar gas pressure of 6.6 MPa causes the $N_2$ partial pressure and the Ar partial pressure within the reaction chamber 11 to become 4 MPa, respectively.

Thereafter, the valves 18 and 21 are closed. As a result, the reaction chamber 11 is sealed. Then, the heater 13 is turned ON, to raise the temperature of the reaction chamber 11 and thus the temperature of the solution 25 from room temperature of 27° C. to the crystal growth temperature of 775° C. in 1 hour.

As the temperature of the reaction chamber 11 rises, the pressure within the sealed reaction chamber 11 increases, and the total pressure within the reaction chamber 11 becomes 8 MPa when the crystal growth temperature of 775° C. is reached. In other words, the $N_2$ partial pressure and the Ar partial pressure within the reaction chamber 11 respectively become 4 MPa.

This state is maintained for 200 hours, before lowering the temperature to the room temperature. When the reaction chamber 11 was opened after the end of the crystal growing process, the present inventors found that virtually all of the Ga reacted with the nitrogen, and a large number of colorless transparent plate-shaped GaN microcrystals 29 were grown on the inner walls of the solution container 12. In addition, the present inventors found that a plate-shaped GaN crystal 30 shown in FIG. 3 having a diameter of approximately 5 mm was grown on the surface of the solution 25. The thickness of the plate-shaped GaN crystal 30 was approximately 80 μm or greater. Furthermore, a halfwidth of an X-ray rocking curve with respect to the plate-shaped GaN crystal 30 was approximately 45 arcsec to approximately 55 arcsec and narrow, and the defect density was approximately $10^6$ cm$^{-2}$ or less by the etch pit density evaluation. Moreover, the plate-shaped GaN crystal 30 had a high resistance and was semiinsulative.

On the other hand, when a similar crystal growing process was performed without supplying the $Li_3N$ into the solution 25, the present inventors found that there remained Ga which did not react with the $N_2$. In addition, the present inventors found that a small columnar GaN crystal and a large number of thin plate-shaped GaN microcrystals having the c-plane as the principal plane were grown on the inner walls of the solution container 12. Moreover, a GaN crystal having a diameter of approximately 3 mm was grown at the surface of the solution 25. When Li was mixed into the solution 25, it was found that only a plate-shaped GaN crystal grows and the growth rate of the GaN crystal is high, thereby enabling a larger GaN crystal to be grown within a shorter time.

Therefore, this embodiment of the method of growing a group III nitride crystal includes growing a group III nitride crystal from a solution in which an alkaline metal, a group III metal and nitrogen are dissolved, and including, in the solution, a material which increases solubility of the nitrogen into the solution. The material may be selected from a group consisting of Li, Ca and alkaline earth metals. When the material is Li, the Li may be included in the solution by adding a nitrogen compound to the solution.

For example, an intermetallic compound of Li and the group III metal fuses at the crystal growing temperature, and will not interfere with the crystal growth. Hence, it is possible to grow a larger group III nitride crystal compared to the conventional method, when the same amount of solution is used.

When the nitrogen compound is used as the Li raw material, it is possible to reduce the weighing error. In other words, a large weighing error may occur when weighing the Li because the mass number of Li is small, but it is possible to reduce the weighing error by using the nitride compound. In addition, no impurity elements will mix into the solution when the nitrogen compound is used, thereby making it possible to grow a high-quality group III nitride crystal.

Accordingly, the group III metal and the nitrogen react within the solution, and the group III nitride crystal of the group III metal and the nitride is grown. By including, in the solution, the material which increases the solubility of the nitrogen into the solution, the group III nitride crystal grows within the solution having a high nitrogen concentration compared to the case where the above material is not dissolved in the solution. For this reason, it is possible to prevent the lack of nitrogen supply which was one cause of the slow growth rate, and accordingly, increase the growth rate. In addition, it is possible to reduce the nitrogen defect caused by the lack of nitrogen supply, and thus grow the group III nitride crystal having a high quality and substantially reduced defects.

The group III nitride may by any suitable compound of nitrogen and one or more group III metals, such as Ga, Al, In and B. In addition, the alkaline metal may be any suitable alkaline metal including Na and K.

The group III metal raw material is not limited to a particular group III material, and any suitable group III material may be used, including group III metals, group III nitrides and materials formed by group III elements. Furthermore, the nitrogen raw material Is not limited to a particular nitrogen material, and any suitable material including nitrogen may be used. Moreover, the nitrogen compound may be dissolved into the solution or, the nitrogen compound gas may be dissolved into the solution in the vapor state.

Second Embodiment

According to a second embodiment, Na is used as a solvent including an alkaline metal, and GaN is used as a group III nitride raw material. The GaN raw material is dissolved into the Na solvent, to grow GaN crystals as a group III nitride at a bottom of a solution container.

Figure 4:
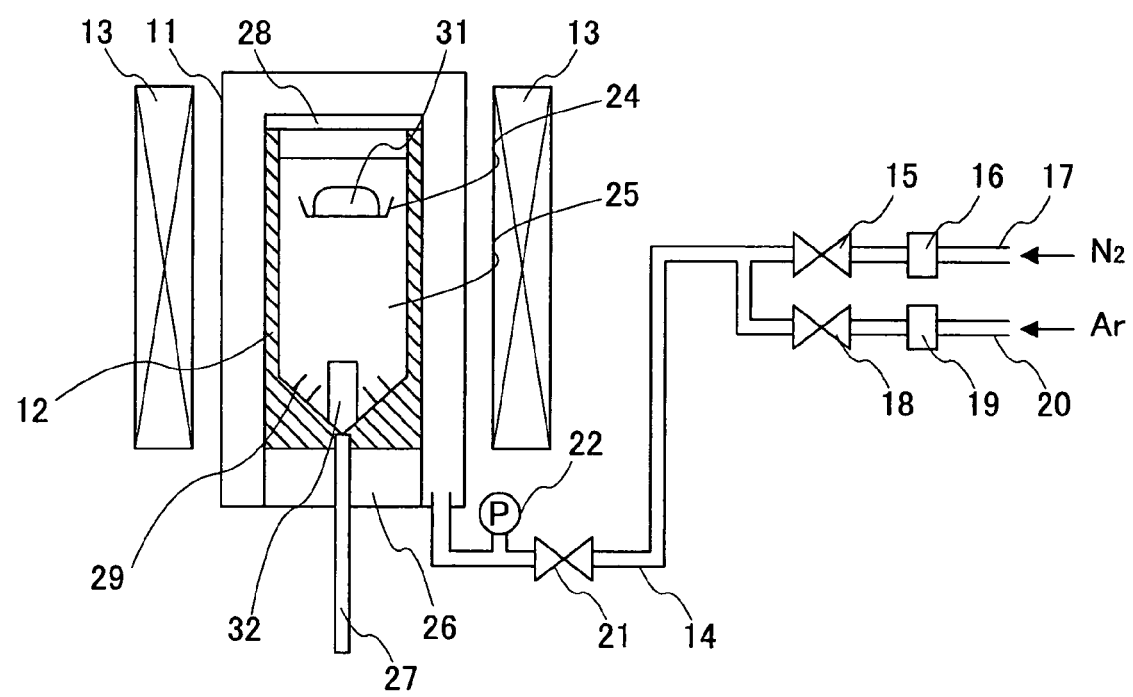
FIG. 4 is a cross sectional view showing a second embodiment of the group III nitride crystal growing apparatus according to the present invention.

FIG. 4 is a cross sectional view showing a second embodiment of the group III nitride crystal growing apparatus. In FIG. 4, those parts which are the same as those corresponding parts in FIG. 2 are designated by the same reference numerals, and a description thereof will be omitted.

The structure of the group III nitride crystal growing apparatus shown in FIG. 4 is basically the same as that of the group III nitride crystal growing apparatus shown in FIG. 2, except for the shape of the solution container 12, the provision of a raw material container 24 which is located at an upper part of the solution container 12 to contain a GaN raw material 31, and the provision of a cooling rod 27 at a bottom portion of the solution container 12.

According to the group III nitride crystal growing apparatus shown in FIG. 4, it is possible to locally set the bottom of the solution container 12 to a low temperature, by the cooling rod 27 which is provided at the bottom portion of the solution container 12.

Next, a description will be given of a second embodiment of the method of growing the group III nitride crystal according to the present invention, which grows GaN, by the group III nitride crystal growing apparatus shown in FIG. 4.

First, the reaction chamber 11 is separated from the group III nitride crystal growing apparatus at the valve 21, and placed into a glove box (not shown) having an Ar atmosphere.

Then, the GaN raw material and the Na solvent are supplied to the solution container 12 which is made of BN. The solution container 12 is placed on the holder 26 and set within the reaction chamber 11. The reaction chamber 11 is sealed, the valve 21 is closed, and the inside of the reaction chamber 11 is shut off from the external atmosphere. The reaction chamber 11 is then removed from the glove box, and assembled into the group III nitride crystal growing apparatus.

In other words, the reaction chamber 11 is set at a predetermined position of the group III nitride crystal growing apparatus where the heater 13 is provided, and is connected to the gas supply pipe 14 at the valve 21 so that the reaction chamber 11 may receive the $N_2$ and Ar gases. Thereafter, the $N_2$ gas is supplied to the reaction chamber 11 so as to prevent the nitrogen from escaping the solution 25 into the vapor phase.

In addition, the Ar gas is supplied to the reaction chamber 11 so as to suppress evaporation of the Na, and the pressure within the reaction chamber 11 is increased.

In this embodiment, the pressure within the reaction chamber 11 is set to 8 MPa, and the partial pressures of the $N_2$ and Ar gases respectively are 4 MPa. Then, the heater 13 is turned ON to raise the temperature of the reaction chamber 11 to 800° C. The GaN crystal is grown by maintaining the temperature of the reaction chamber 11 at 800° C. for 300 hours, and the temperature of the reaction chamber 11 is thereafter reduced to the room temperature. While the temperature of the reaction chamber 11 is maintained at 800° C., the GaN raw material 31 gradually dissolves, and is recrystallized at the bottom of the solution container 12 where the temperature is low, to thereby grow the GaN crystal. When the reaction chamber 11 was opened after the end of the crystal growing process, it was found that the GaN raw material 31 slightly remains, and a columnar colorless transparent GaN crystal 32 having a length of approximately 3 mm and a large number of GaN microcrystals 29 were grown at the bottom of the solution container 12.

Therefore, this embodiment of the method of growing the group III nitride crystal grows the group III nitride crystal by dissolving a group III nitride into a solvent which includes the alkaline metal and recrystallizing the group III nitride. In other words, unlike the conventional method, the group III nitride is used as the raw material, and the group III nitride is dissolved and recrystallized within the solvent.

Hence, the raw material required for the crystal growth is stably supplied, and a practically large group III nitride crystal having a high quality can be grown.

Conventionally, no suitable solvent existed that dissolved the group III nitride with a solubility required for the crystal growth. But by using the solvent including the alkaline metal, it is possible to dissolve the group III nitride with the solubility required for the crystal growth, and to recrystallize the group III nitride to grow the group III nitride crystal.

Na, K and the like may be used for the alkaline metal included in the solvent or used as the solvent. However, the alkaline metal of the solvent is not limited to such, and any suitable material may be used depending on the group III nitride to be dissolved. For example, when fusing GaN as the group III nitride, Na may be used as a suitable alkaline metal for the solvent.

The method of recrystallization is also not limited to a particular method. For example, a temperature difference may be generated in the solution, so as to dissolve the group III nitride at the high temperature portion of the solution and to recrystallize the group III nitride at the low temperature portion of the solution. Alternatively, it is possible to reduce the temperature of the solution in which the group III nitride is dissolved by an amount greater than or equal to the saturated concentration, so as to cause the recrystallization of the group III nitride. Furthermore, the solvent may be evaporated so as to supersaturate the solvent concentration, so as to cause the recrystallization of the group III nitride.

In order to prevent the nitrogen defect, it is possible to supply the nitrogen into the solution by use a nitrogen raw material, separately from the nitrogen obtained by the dissolving of the group III nitride.

Third Embodiment

According to a third embodiment, Na is used as a solvent including an alkaline metal, and GaN is used as a group III nitride raw material. The GaN raw material is dissolved into the Na solvent, and the Na solvent is evaporated to form a saturated solution, so as to segregate the supersaturated GaN and grow GaN crystals as a group III nitride.

Figure 5:
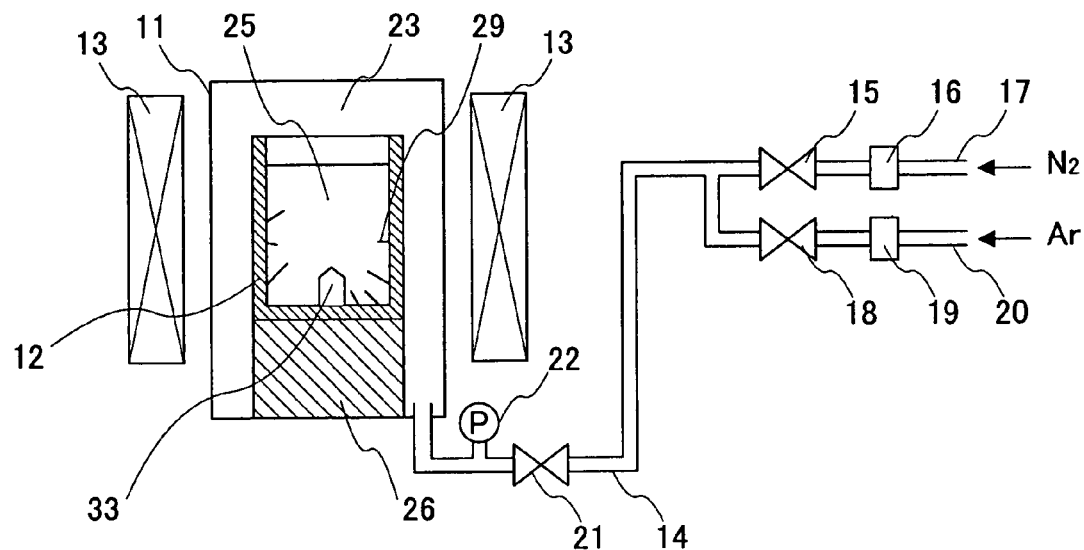
FIG. 5 is a cross sectional view showing a third embodiment of the group III nitride crystal growing apparatus according to the present invention.

FIG. 5 is a cross sectional view showing a third embodiment of the group III nitride crystal growing apparatus. In FIG. 5, those parts which are the same as those corresponding parts in FIG. 2 are designated by the same reference numerals, and a description thereof will be omitted. The structure of the group III nitride crystal growing apparatus shown in FIG. 5 is basically the same as that of the group III nitride crystal growing apparatus shown in FIG. 2.

Next, a description will be given of a third embodiment of the method of growing the group III nitride crystal according to the present invention, which grows GaN, by the group III nitride crystal growing apparatus shown in FIG. 5.

The GaN raw material and the Na solvent are supplied to the solution container 12 and heated to 800° C. so as to dissolve the GaN raw material. The $N_2$ gas is supplied to the reaction chamber 11 so as to prevent the nitrogen from escaping the solution 25 into the vapor phase, and the $N_2$ gas is used to set the pressure within the reaction chamber 11 to 4 MPa.

The reaction chamber 11 is maintained at 800° C. for 400 hours to evaporate the Na solvent. As the Na solvent evaporates, the solution 25 reaches a supersaturated state, and the supersaturated GaN is segregated to grow the GaN crystals. When the reaction chamber 11 was opened after the end of the crystal growing process, it was found that the Na solvent is reduced, and a columnar colorless transparent GaN crystal 33 having a length of approximately 3 mm and a large number of GaN microcrystals 29 were grown at the bottom of the solution container 12.

Therefore, this embodiment of the method of growing the group III nitride crystal includes setting a concentration of the group III nitride within the solution to become greater than or equal to a saturated concentration, so as to segregate the group III nitride and grow the group III nitride crystal. In other words, the crystal segregation occurs and the crystal growth can be started when the dissolved concentration of the group III nitride within the solution becomes greater than or equal to the saturated concentration.

The method of making the group III nitride concentration within the solution to become greater than or equal to the saturated concentration is not limited to a particular method. For example, the temperature of the solution may be reduced, so that the group III nitride concentration becomes greater than or equal to the saturated concentration. Alternatively, differences in the solubilities of the group III nitride caused by the temperature of the solution may be effectively utilized to grow the group III nitride crystal.

Fourth Embodiment

According to a fourth embodiment, Na is used as an alkaline metal, and GaN is used as a group III nitride raw material. The GaN raw material is dissolved into the Na solution, and the solution temperature is gradually reduced to form a saturated solution, so as to segregate the supersaturated GaN and grow GaN crystals as a group III nitride.

Figure 6:
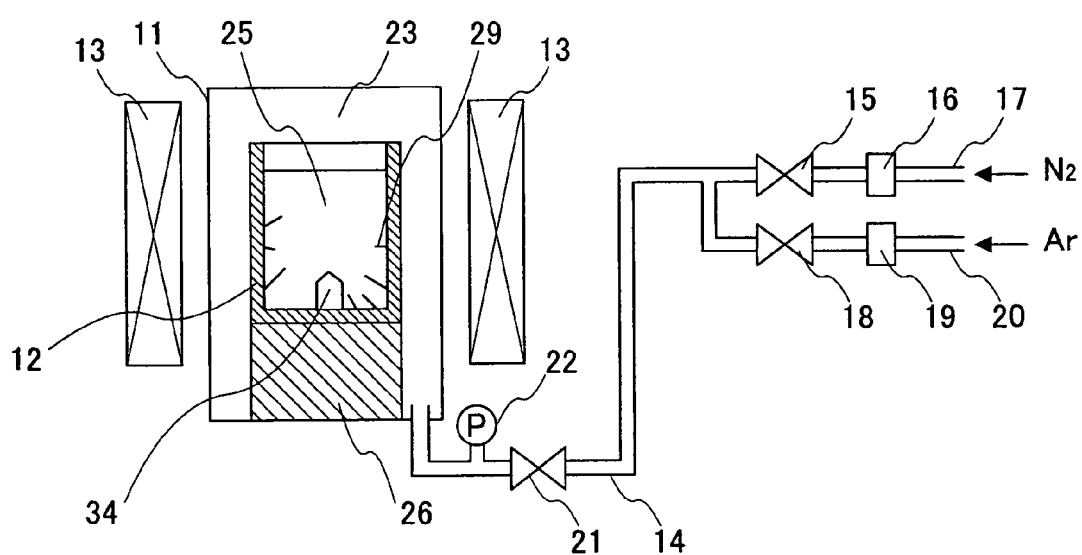
FIG. 6 is a cross sectional view showing a fourth embodiment of the group III nitride crystal growing apparatus according to the present invention.

FIG. 6 is a cross sectional view showing a fourth embodiment of the group III nitride crystal growing apparatus. In FIG. 6, those parts which are the same as those corresponding parts in FIG. 2 are designated by the same reference numerals, and a description thereof will be omitted. The structure of the group III nitride crystal growing apparatus shown in FIG. 6 is basically the same as that of the group III nitride crystal growing apparatus shown in FIG. 2.

Next, a description will be given of a fourth embodiment of the method of growing the group III nitride crystal according to the present invention, which grows GaN, by the group III nitride crystal growing apparatus shown in FIG. 6.

The GaN raw material and the Na are supplied to the solution container 12 and heated, so as to dissolve the GaN raw material.

Figure 7:
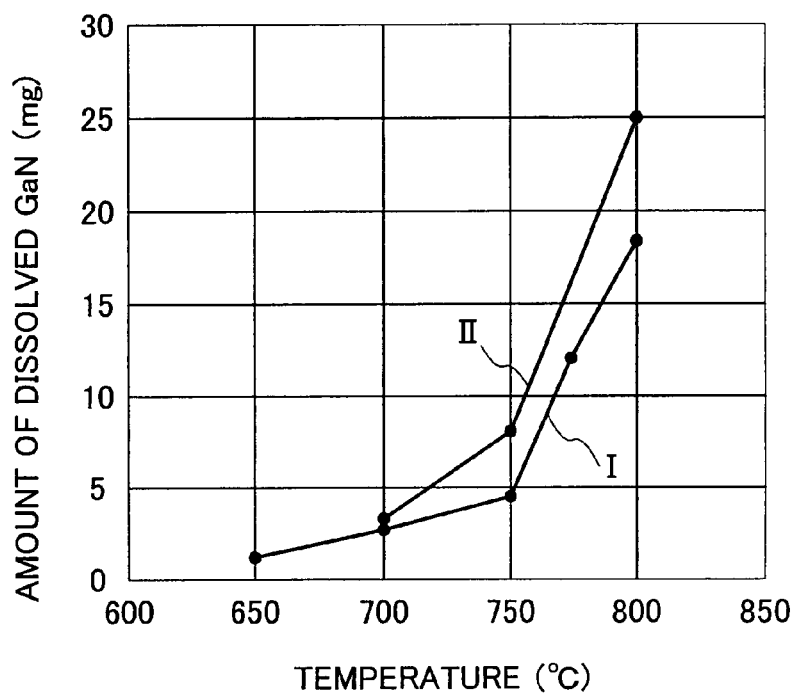
FIG. 7 is a diagram showing an amount of dissolved GaN within 1 g of Na with respect to the temperature.

FIG. 7 is a diagram showing an amount of dissolved GaN within 1 g of Na with respect to the temperature of the molten mixture, obtained from experiments conducted by the present inventors. In FIG. 7, the ordinate indicates the amount of dissolved GaN in mg, and the abscissa indicates the temperature in ° C. In addition, a curve I shows a case where no Li is added as in the case of this embodiment, and a curve II shows a case where Li is added as in the case of a fifth embodiment which will be described later.

It may be seen from FIG. 7 that the amount of dissolved GaN increases sharply when the temperature becomes 750° C. or greater. In this embodiment, 15 g of Na is supplied to the solution container 12, and 270 mg of GaN raw material is supplied to the solution container 12. The solution container 12 is then heated to 800° C. to dissolve the GaN raw material and form a saturated solution. The present inventors have found through experiments that the reaction of the dissolved GaN reaches an equilibrium state in 50 hours to 100 hours. In this embodiment, the solution container 12 is maintained at 800° C. for 50 hours to dissolve the GaN raw material. Thereafter, the solution container 12 is cooled from 800° C. to 700° C. at a cooling rate of 1° C./hour.

The $N_2$ gas is supplied to the internal space 23 within the reaction chamber 11 so as to prevent the nitrogen from escaping the solution 25 into the vapor phase. In addition, the Ar gas is supplied to the internal space 23 within the reaction chamber 11 so as to suppress evaporation of the Na, and the pressure within the reaction chamber 11 is increased. The pressure within the reaction chamber 11 is set to 8 MPa, and the partial pressures of the $N_2$ and Ar gases respectively are 4 MPa.

As the temperature of the solution 25 falls, the solution 25 reaches a supersaturated state, and the supersaturated GaN is segregated to grow GaN crystals. When the reaction chamber 11 was opened after the end of the crystal growing process, a colorless transparent GaN crystal 34 having a size of approximately 2 mm and a large number of GaN microcrystals 29 were grown at the bottom of the solution container 12.

Therefore, this embodiment of the method of growing the group III nitride sets the concentration of the group III nitride within the solution to become greater than or equal to the saturated concentration by decreasing a temperature of the solution. In other words, since the solubility of the group III nitride decreases when the temperature of the alkaline metal decreases, the solution reaches the supersaturated state as the temperature of the solution decreases, to cause segregation of the group III nitride. Hence, the differences in the solubilities of the group III nitride caused by the temperature of the solution are effectively utilized to grow the group III nitride crystal.

Accordingly, the crystal growth rate can be controlled by the temperature falling rate of the solution, to thereby control the crystal quality. As a result, it is possible to grow a high-quality group III nitride crystal.

Fifth Embodiment

According to the fifth embodiment, Na is used as an alkaline metal, and GaN is used as a group III nitride raw material. Furthermore, $Li_3N$ is dissolved as a raw material into the solution of Na and GaN, so as to add Li which increases the solubility of nitrogen in the solution, that is, increases the solubility of GaN. The GaN raw material is dissolved into the Na solution, and the solution temperature is gradually reduced to form a saturated solution, so as to segregate the supersaturated GaN and grow GaN crystals as a group III nitride.

In other words, this embodiment is similar to the fourth embodiment described above, except that Li is dissolved into the solution.

A fifth embodiment of the group III nitride crystal growing apparatus has the same structure as the fourth embodiment of the group III nitride crystal growing apparatus shown in FIG. 6.

Next, a description will be given of a fifth embodiment of the method of growing the group III nitride crystal according to the present invention, which grows GaN, by the group III nitride crystal growing apparatus shown in FIG. 6.

This fifth embodiment of the method is basically the same as the fourth embodiment of the method described above, except that $Li_3N$ is dissolved into the solution 25 so as to add Li to the solution 25. The addition of Li increases the solubility of the nitrogen, that is, increases the solubility of the GaN. Hence, a larger amount of the GaN raw material is supplied compared to the fourth embodiment which does not add Li.

In FIG. 7, the curve II shows the amount of dissolved GaN within 1 g of Na with respect to the temperature of the molten mixture, for a case where 0.1 mmol of $Li_3N$ is dissolved into the molten mixture to add the Li. On the other hand, the curve I shows the amount of dissolved GaN within 1 g of Na with respect to the temperature of the molten mixture, for the case where no Li is added.

In this fifth embodiment, 15 g of Na, 1.5 mmol of $Li_3N$ and 375 mg of GaN raw material are supplied to the solution container 12, and maintained at 800° C. for 50 hours to dissolve the GaN raw material and form a saturated solution. Thereafter, the solution container 12 is cooled from 800° C. to 700° C. at a cooling rate of 1° C./hour.

The $N_2$ gas is supplied to the internal space 23 within the reaction chamber 11 so as to prevent the nitrogen from escaping the solution 25 into the vapor phase. In addition, the Ar gas is supplied to the internal space 23 within the reaction chamber 11 so as to suppress evaporation of the Na, and the pressure within the reaction chamber 11 is increased. The pressure within the reaction chamber 11 is set to 8 MPa, and the partial pressures of the $N_2$ and Ar gases respectively are 4 MPa.

As the temperature of the solution 25 falls, the solution 25 reaches a supersaturated state, and the supersaturated GaN is segregated to grow GaN crystals. When the reaction chamber 11 was opened after the end of the crystal growing process, a colorless transparent GaN crystal 34 having a size of approximately 3 mm and a large number of GaN microcrystals 29 were grown at the bottom of the solution container 12. Compared to the case where no Li is added to the solution 25, the amount of GaN crystal grown increases by an amount corresponding to a difference between the solubilities of GaN for the case where Li is added and the case where no Li is added, to simultaneously increase the GaN crystal size.

Therefore, this embodiment of the method of growing the group III nitride selects the material from a group consisting of alkaline metals other than the alkaline metal included in the solvent. In other words, the material which increases the solubility of the nitrogen into the solution, increases the solubility of the group III nitride into the solution. Any suitable material which does not interfere with the crystal growth may be used for this material which increases the solubility of the nitrogen into the solution. The material may be selected from a group consisting of Li, Ca and alkaline earth metals. In addition, when the material is Li, the Li may be included in the solution by adding a nitrogen compound to the solution.

Accordingly, it is possible to increase the nitrogen concentration within the solution compared to the conventional method, and increase the solubility of the group III nitride. Consequently, a larger group III nitride crystal may be grown compared to the conventional method, using the same amount of solution. In addition, since the nitrogen concentration within the solution is increased, it is possible to suppress the lack of nitrogen supply and accordingly, reduce defects such as nitrogen defects. As a result, it is possible to grow a high-quality group III nitride crystal.

Sixth Embodiment

A sixth embodiment is similar to the fifth embodiment described above, except that a seed crystal is used to grow the crystals. In other words, Na is used as an alkaline metal, GaN is used as a group III nitride raw material, and $Li_3N$ is dissolved as a raw material into the solution of Na and GaN so as to add Li which increases the solubility of nitrogen in the solution, that is, increases the solubility of GaN. The GaN raw material is dissolved into the Na solution, and the solution temperature is gradually reduced to form a saturated solution, so as to segregate the supersaturated GaN and grow GaN crystals as a group III nitride.

Figure 8:
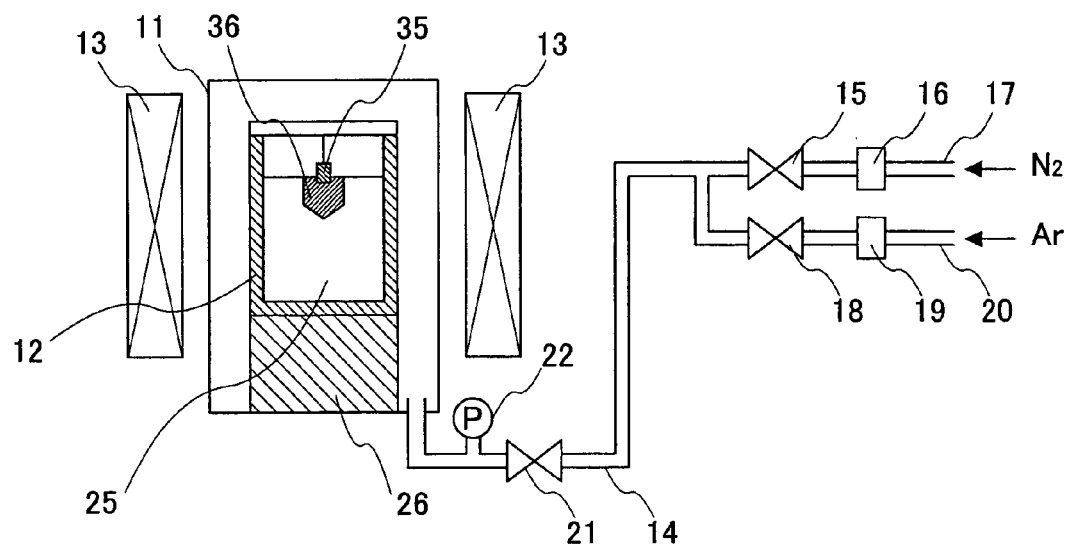
FIG. 8 is a cross sectional view showing a sixth embodiment of the group III nitride crystal growing apparatus according to the present invention.

FIG. 8 is a cross sectional view showing a sixth embodiment of the group III nitride crystal growing apparatus. In FIG. 8, those parts which are the same as those corresponding parts in FIG. 2 are designated by the same reference numerals, and a description thereof will be omitted. The structure of the group III nitride crystal growing apparatus shown in FIG. 8 is basically the same as that of the group III nitride crystal growing apparatus shown in FIG. 2, except that a mechanism is provided to hold the seed crystal.

Next, a description will be given of a sixth embodiment of the method of growing the group III nitride crystal according to the present invention, which grows GaN, by the group III nitride crystal growing apparatus shown in FIG. 8.

This embodiment grows the GaN crystal in a manner similar to the fifth embodiment described above, except that a seed crystal 35 is immersed in a vicinity of the surface of the solution 25 so as to grow the GaN crystal thereat.

The GaN raw material which is dissolved into the solution 25 is drawn towards the surface of the seed crystal 35, and the GaN crystal preferentially grows on the seed crystal 35. The solution container 12 is cooled from 800° C. to 700° C. at a cooling rate of 1° C./hour. When the reaction chamber 11 was opened after the end of the crystal growing process, a colorless transparent GaN single crystal 36 having a length of approximately 5 mm was grown on the seed crystal 35. The GaN crystal 36 which is grown on the seed crystal 35 had a larger crystal size compared to the case where no seed crystal is used.

Therefore, this embodiment of the method of growing the group III nitride crystal selects the material from a group consisting of Li, Ca and alkaline earth metals. When the material is Li, the Li may be included in the solution by adding a nitrogen compound to the solution. Further, the group III nitride crystal may be grown on a seed crystal.

Hence, it is possible to selectively grow the group III nitride crystal on the seed crystal, and a practically large group III nitride crystal having a high quality can be grown at a desired position. Moreover, it is possible to control the crystal orientation of the group III nitride crystal which is grown, because the seed crystal is used. In other words, it is possible to grow a group III nitride crystal having a desired crystal face.

Seventh Embodiment

According to a seventh embodiment, Na is used as an alkaline metal, and GaN is used as a group III nitride raw material. Furthermore, $Li_3N$ is dissolved as a raw material into the solution of Na and GaN, so as to add Li which increases the solubility of nitrogen in the solution, that is, increases the solubility of GaN. The GaN raw material is dissolved into the Na solution at a high temperature portion, and the GaN is segregated on a seed crystal at a low temperature portion to grow the GaN crystals as a group III nitride.

Figure 9B:
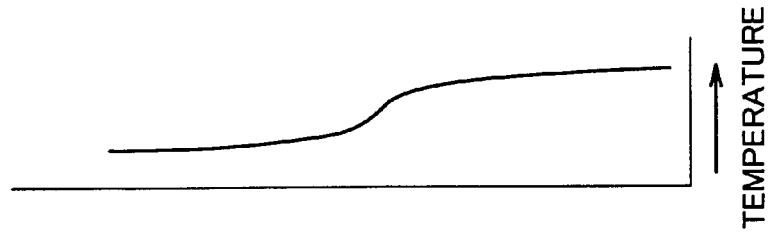
FIG. 9B is a diagram showing a temperature distribution within a reaction chamber of the group III nitride crystal growing apparatus shown in FIG. 9A along a vertical direction.
Figure 9A:
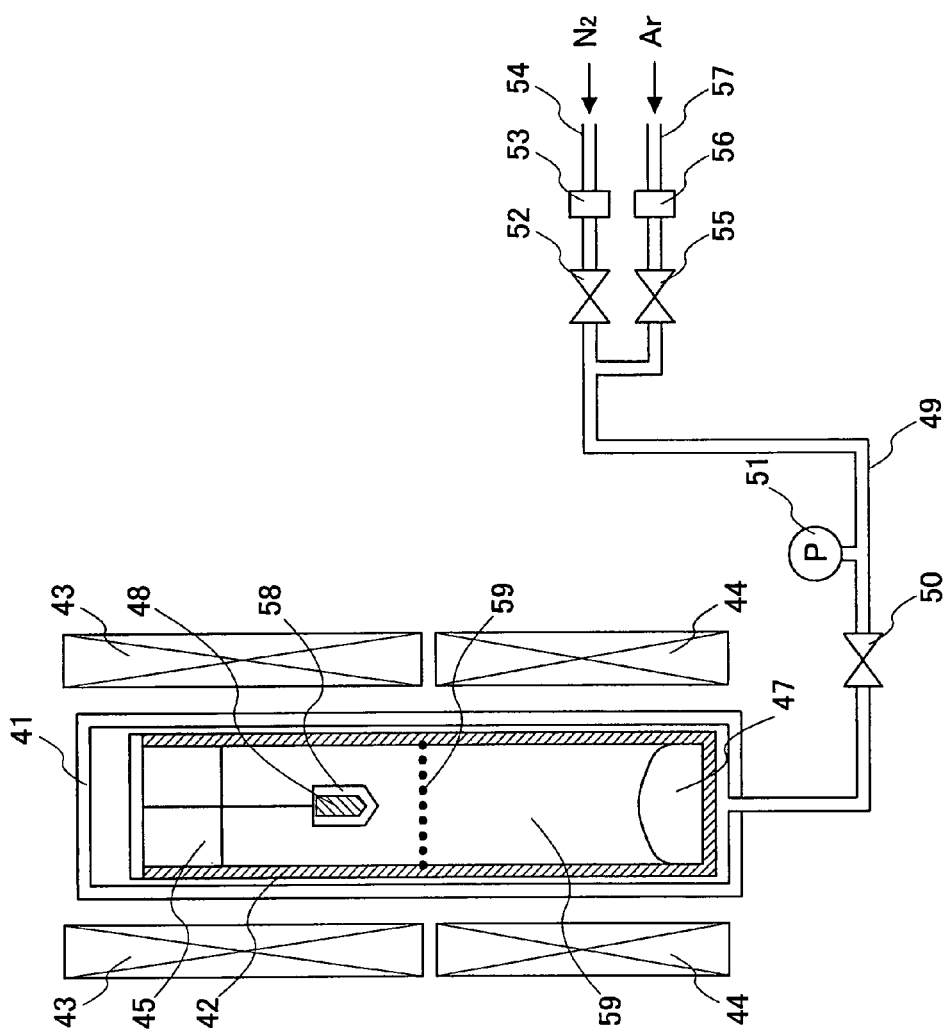
FIG. 9A is a cross sectional view showing a seventh embodiment of the group III nitride crystal growing apparatus according to the present invention.

FIG. 9A is a cross sectional view showing a seventh embodiment of the group III nitride crystal growing apparatus, and FIG. 9B is a diagram showing a temperature distribution within a reaction chamber of the group III nitride crystal growing apparatus shown in FIG. 9A along a vertical direction. In FIG. 9B, the ordinate indicates the distance along the vertical direction of the reaction chamber in arbitrary units, and the abscissa indicates the temperature in arbitrary units.

The group III nitride crystal growing apparatus shown in FIG. 9A includes a reaction chamber 41 which accommodates a solution container 42. The reaction chamber 41 is made of stainless steel and has a closed shape. A solution 59 including the alkaline metal is contained within the solution container 42. The solution container 42 contains the solution 59 which is required for the crystal growth of the GaN.

The solution container 42 may be removed from the reaction chamber 41. In this embodiment, the solution container 42 is made of BN.

A gas supply pipe 49 connects to the reaction chamber 41. The gas supply pipe 49 supplies $N_2$ gas to an internal space 45 within the reaction chamber 41, as the nitrogen raw material, and enables adjustment of the $N_2$ gas pressure within the reaction chamber 41 from a pressure control unit 53.

The gas supply pipe 49 branches via a valve 55 so that Ar gas may be introduced to suppress evaporation of the alkaline metal. The Ar gas pressure may be adjusted from a pressure control unit 56.

The Ar gas is mixed as an inert gas to suppress the evaporation of the alkaline metal and to independently control the pressure of the $N_2$ gas. Hence, it is possible to perform the crystal growing process with a high controllability.

The total pressure within the reaction chamber 41 is monitored by a pressure gage 51. An upper heater 43 and a lower heater 44 are arranged on an outer side of the reaction chamber 41. Each of the upper and lower heaters 43 and 44 can be controlled to a desired temperature. Valves 52 and 50 are provided in the gas supply pipe 49. The reaction chamber 41 may be removed from the group III nitride crystal growing apparatus at the valve 50, so that only the reaction chamber 41 may be placed into a glove box and worked on by an operator.

A buffer 46 is provided within the solution container 42, in order to suppress convection of the solution 59 and to generate a temperature gradient.

Next, a description will be given of a seventh embodiment of the method of growing the group III nitride crystal according to the present invention, which grows GaN, by the group III nitride crystal growing apparatus shown in FIG. 9A.

First, the reaction chamber 41 is separated from the group III nitride crystal growing apparatus at the valve 50, and placed into a glove box (not shown) having an Ar atmosphere.

Then, GaN is supplied as the group III nitride raw material, Na is supplied as the alkaline metal, and $Li_3N$ is supplied, into the solution container 42 which is made of BN. The Na within the solution container 42 is fused, and a GaN seed crystal 48 which hangs from an upper portion of the solution container 42 is held at a predetermined position within the solution 59.

Next, the solution container 42 is set within the reaction chamber 41. The reaction chamber 41 is sealed, the valve 50 is closed, and the inside of the reaction chamber 41 is shut off from the external atmosphere.

Since the series of operations are carried out within the glove box under the Ar gas atmosphere, the inside of the reaction chamber 41 is filled with the Ar gas. The reaction chamber 41 is then removed from the glove box, and assembled into the group III nitride crystal growing apparatus. In other words, the reaction chamber 41 is set at a predetermined position of the group III nitride crystal growing apparatus where the upper and lower heaters 43 and 44 are provided, and is connected to the gas supply pipe 49 at the valve 50 so that the reaction chamber 41 may receive the $N_2$ and Ar gases. Then, the upper and lower heaters 43 and 44 are turned ON, to raise the temperature of the reaction chamber 41 and thus the temperature of the solution 59, to a predetermined crystal growing temperature.

The lower heater 44 is set to a dissolving temperature of a GaN raw material 47. On the other hand, the upper heater 43 is set to a temperature which is lower than that at a portion where the GaN raw material 47 exists. More particularly, the upper heater 43 is set to a crystal growing temperature at which the GaN seed crystal 48 grows. In this embodiment, the portion where the GaN raw material 47 exists is set to 850° C., and the portion where the GaN seed crystal 48 grows is set to 775° C.

The valves 50 and 55 are then opened, to supply the Ar gas from an Ar gas supply pipe 57 to the reaction chamber 41 via the gas supply pipe 49. The pressure within the reaction chamber 41 is adjusted by the pressure control unit 56, and the valve 55 is closed after setting the total pressure within the reaction chamber 41 to 4 MPa.

Thereafter, the valve 52 is opened, to supply the $N_2$ gas from a $N_2$ gas supply pipe 54 to the reaction chamber 41 via the gas supply pipe 49. The pressure within the reaction chamber 41 is adjusted by the pressure control unit 53, so that the total pressure within the reaction chamber 41 is 8 MPa. In other words, the $N_2$ partial pressure within the internal space 45 of the reaction chamber 41 is 4 MPa.

This state is maintained for 400 hours to carry out the crystal growing process, and the temperature of the reaction chamber 41 is then reduced to the room temperature. When the reaction chamber 41 was opened after reducing the gas pressure within the reaction chamber 41, it was found that a colorless transparent GaN single crystal 58 having a length of approximately 10 mm was grown on the seed crystal 48.

Therefore, this embodiment of the method of growing the group III nitride crystal also selects the material from a group consisting of Li, Ca and alkaline earth metals. When the material is Li, the Li may be included in the solution by adding a nitrogen compound to the solution. Further, the group III nitride crystal may be grown on a seed crystal.

Hence, it is possible to selectively grow the group III nitride crystal on the seed crystal, and a practically large group III nitride crystal having a high quality can be grown at a desired position. Moreover, it is possible to control the crystal orientation of the group III nitride crystal which is grown, because the seed crystal is used. In other words, it is possible to grow a group III nitride crystal having a desired crystal face.

Eighth Embodiment

According to an eighth embodiment, Na is used as an alkaline metal, and Ga is used as a group III metal raw material. Nitrogen gas is used as nitrogen raw material, and Li is added using $Li_3N$ as a raw material, to grow GaN crystals as a group III nitride.

The Na, Ga and $Li_3N$ may be prepared in advance as a molten mixture within a solution container, and the nitrogen may be supplied during the crystal growth by fusion from a vapor phase into the molten mixture, to grow the GaN crystals.

Figure 10:
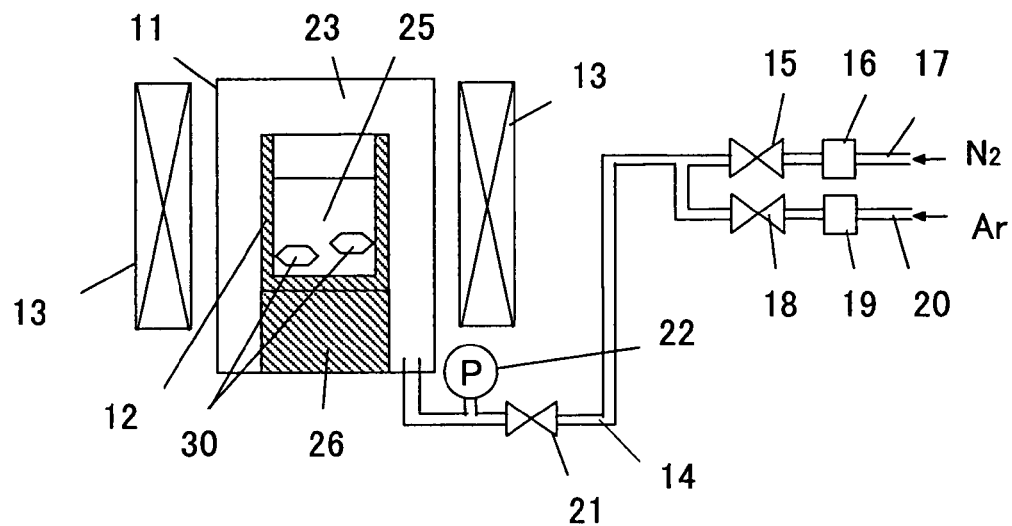
FIG. 10 is a cross sectional view showing an eighth embodiment of the group III nitride crystal growing apparatus according to the present invention.

FIG. 10 is a cross sectional view showing an eighth embodiment of the group III nitride crystal growing apparatus. In FIG. 10, those parts which are the same as those corresponding parts in FIG. 2 are designated by the same reference numerals, and a description thereof will be omitted. An eighth embodiment of the group III nitride crystal, which is obtained by growing the GaN crystal by the group III nitride crystal growing apparatus shown in FIG. 10, becomes the same as the colorless transparent plate-shaped GaN crystal 30 shown in FIG. 3.

In this embodiment, the crystal growing process may be carried out under similar conditions as those of the first embodiment described above, except that the Li is added to the solution as a material which controls the ratio of growth rates of the group III nitride crystal in two approximately perpendicular directions.

In other words, this embodiment of the method of growing the group III nitride crystal comprises growing a group III nitride crystal from a solution in which an alkaline metal, a group III metal and nitrogen are dissolved, and including, in the solution, a material which controls a ratio of a growth rate of the group III nitride crystal in a first direction approximately parallel to a c-axis thereof and a growth rate of the group III nitride crystal in a second direction approximately perpendicular to the c-axis direction thereof.

Materials such as Li make the growth rate of the group III nitride crystal in the second direction higher than that in the first direction. In this case, it is possible to grow the plate-shaped group III nitride crystal 30 which extends in a planar manner along the second direction which is approximately perpendicular to the c-axis direction thereof.

On the other hand, materials such as Ni, Mn, Fe and Co, which are transition metals, make the growth rate of the group III nitride crystal in the first direction higher than that in the second direction. In this case, it is possible to grow a columnar group III nitride crystal which is elongated along the first direction which is approximately parallel to the c-axis direction thereof.

Of course, the material which controls the ratio of the growth rates in the first and second direction may control the ratio so that the two growth rates are the same.

Accordingly, it is possible to control the form or shape of the group III nitride crystal that is grown.

Furthermore, when the Li is added to the solution, the present inventors confirmed that the group III nitride crystal which is grown has a large resistance on the order of approximately several M$\Omega$, even when no special impurity is mixed into the solution.

The following shows a comparison of the properties of the group III nitride crystals which are grown using the solution without Li (additive) and the solution with Li (additive), where "XRC FWHM" indicates a halfwidth of an X-ray rocking curve with respect to the grown group III nitride crystal, and "EPD" indicates the defect density obtained by the etch pit density evaluation.

Case 1: Without Li (Additive)

Conductivity type: n-type

Resistivity: 0.04 $\Omega$cm

Carrier Concentration: 1 to $2\times10^{18}$ cm$^{-3}$

XRC FWHM (0002): 45 to 55 arcsec

EPD: $\leqq 10^6$ cm$^{-2}$

Case 2 (Eighth Embodiment): With Li (Additive)

Conductivity type: Semi-insulative

Resistivity: $\geqq 10^4$ $\Omega$cm

Carrier Concentration: ---

XRC FWHM (0002): 45 to 55 arcsec

EPD: $\leqq 10^6$ cm$^{-2}$

Ninth Embodiment

According to a ninth embodiment, Na is used as an alkaline metal, and Ga is used as a group III metal raw material. Nitrogen gas is used as nitrogen raw material, and Ni is added, to grow GaN crystals as a group III nitride.

The Na, Ga and Ni may be prepared in advance as a molten mixture within a solution container, and the nitrogen may be supplied during the crystal growth by fusion from a vapor phase into the molten mixture, to grow the GaN crystals.

Figure 11:
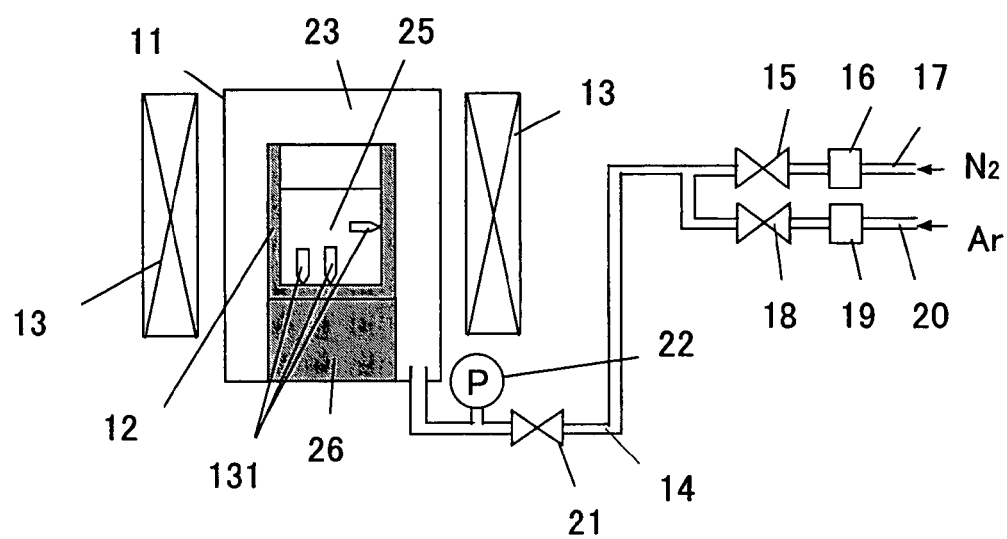
FIG. 11 is a cross sectional view showing a ninth embodiment of the group III nitride crystal growing apparatus according to the present invention.
Figure 12:
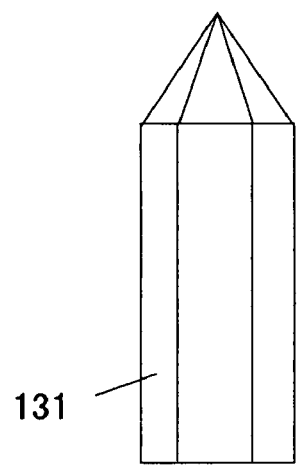
FIG. 12 is a side view showing a columnar GaN crystal which is obtained by growing a GaN crystal by the group III nitride crystal growing apparatus shown in FIG. 11.

FIG. 11 is a cross sectional view showing a ninth embodiment of the group III nitride crystal growing apparatus. In FIG. 11, those parts which are the same as those corresponding parts in FIG. 10 are designated by the same reference numerals, and a description thereof will be omitted. FIG. 12 is a side view showing a columnar GaN crystal, that is, a ninth embodiment of the group III nitride crystal, which is obtained by growing the GaN crystal by the group III nitride crystal growing apparatus shown in FIG. 11.

In this embodiment, the crystal growing process may be carried out under similar conditions as those of the eighth embodiment described above, except that the Ni is added to the solution, in place of Li, as a material which controls the ratio of growth rates of the group III nitride crystal in two approximately perpendicular directions.

After the crystal growing process is carried out for 300 hours, colorless transparent columnar GaN crystals 131 having a length of 5 mm along the c-axis direction were grown on the inner walls of the solution container 12.

On the other hand, when the Ni is not included in the solution 25 when carrying out a similar crystal growing process, it was found that a columnar GaN crystal having a short length along the c-axis and a large number of plate-shaped GaN crystals having the c-plane as the principal plane are grown.

The present inventors confirmed through experiments that the growth rate of the GaN crystal in the c-axis direction becomes higher when the Ni is mixed into the solution 25, and that a larger columnar GaN crystal can be grown within a shorter time compared to the case where the Ni is not mixed into the solution 25.

Accordingly, it is possible to control the columnar shape of the group III nitride crystal that is grown. In other words, since the group III nitride crystal can be grown in an ingot shape, a large number of group III nitride substrates can be produced at a low cost by slicing the ingot-shaped group III nitride crystal.

Tenth Embodiment

According to a tenth embodiment, Na is used as an alkaline metal, and Ga is used as a group III metal raw material. Nitrogen gas is used as nitrogen raw material, and Li is added using Li$_3$N as a raw material, to grow GaN crystals as a group III nitride.

The Na, Ga and Li$_3$N may be prepared in advance as a molten mixture within a solution container, and the nitrogen may be supplied during the crystal growth by fusion from a vapor phase into the molten mixture, to grow the GaN crystals.

Figure 13:
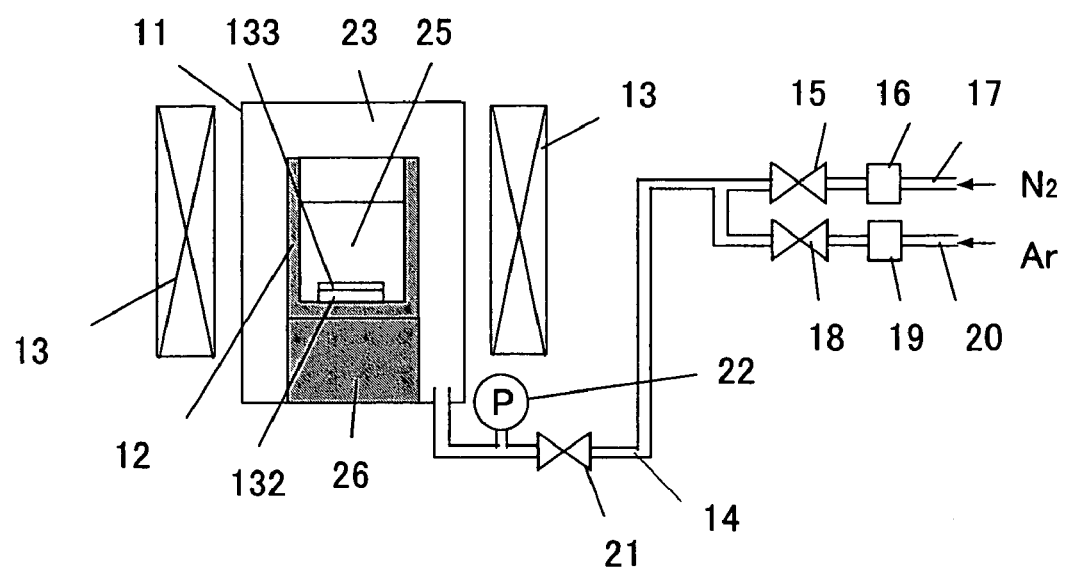
FIG. 13 is a cross sectional view showing a group III nitride crystal growing apparatus according to the present invention.
Figure 14:
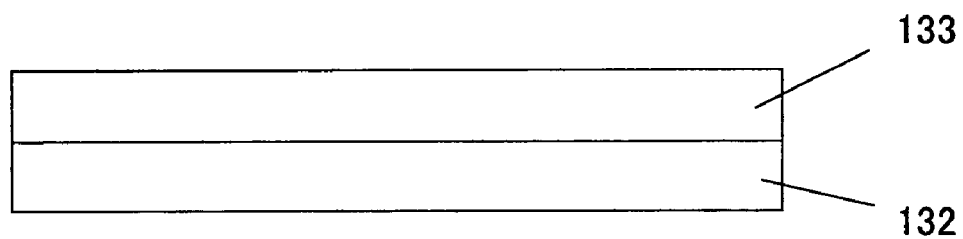
FIG. 14 is a cross sectional view showing a plate-shaped GaN crystal which is obtained by growing the GaN crystal by the group III nitride crystal growing apparatus shown in FIG. 13.
Figure 15:
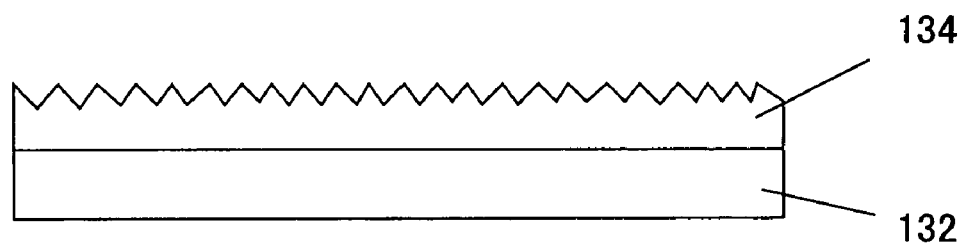
FIG. 15 is a cross sectional view showing a plate-shaped GaN crystal which is obtained by growing the GaN crystal by the group III nitride crystal growing apparatus shown in FIG. 13 when no Li is added to the solution, for comparison purposes.

FIG. 13 is a cross sectional view showing a tenth embodiment of the group III nitride crystal growing apparatus. In FIG. 13, those parts which are the same as those corresponding parts in FIG. 10 are designated by the same reference numerals, and a description thereof will be omitted. FIG. 14 is a cross sectional view showing a plate-shaped GaN crystal, that is, a tenth embodiment of the group III nitride crystal, which is obtained by growing the GaN crystal by the group III nitride crystal growing apparatus shown in FIG. 13. In addition, FIG. 15 is a cross sectional view showing a plate-shaped GaN crystal which is obtained by growing the GaN crystal by the group III nitride crystal growing apparatus shown in FIG. 13 when no Li is added to the solution, for comparison purposes.

In this embodiment, the crystal growing process may be carried out under similar conditions as those of the eighth embodiment described above, except that the Li is added to the solution as a material which controls the ratio of growth rates of the group III nitride crystal in two approximately perpendicular directions, and that a plate-shaped GaN crystal having the c-plane as the principal plane is used as a seed crystal.

More particularly, the reaction chamber 11 is first separated from the group III nitride crystal growing apparatus at the valve 21, and placed into a glove box (not shown) having an Ar atmosphere.

Then, a plate-shaped GaN crystal having the c-plane as the principal plane, is set in the solution container 12, as a seed crystal 132. Next, Ga is supplied as the group III metal raw material and Na is supplied as the alkaline metal, into the solution container 12 which is made of BN. A proportion of Na in the solution 25 is set to Na/(Na+Ga)=0.4.

In addition, $Li_3N$ is supplied as the Li raw material, into the solution container 12.

Next, the solution container 12 is placed on the holder 26 and set within the reaction chamber 11. Thereafter, the crystal growing process is carried out similarly to the eighth (or first) embodiment.

After the crystal growing process is carried out for 300 hours, a colorless transparent plate-shaped GaN crystal 133 having a smooth surface was grown on the seed crystal 132, as shown in FIG. 14.

On the other hand, when the Li is not included in the solution 25 when carrying out a similar crystal growing process, it was found that a GaN crystal 134 having a rough surface was grown on the seed crystal 132, as shown in FIG. 15.

Hence, it was confirmed that the plate-shaped GaN crystal 133 having the flat surface is obtained when the Li is mixed into the solution 25. Furthermore, a halfwidth of an X-ray rocking curve with respect to the plate-shaped GaN crystal 133 was approximately 45 arcsec to approximately 55 arcsec and narrow, and the defect density was approximately $10^6$ $cm^{-2}$ or less by the etch pit density evaluation. Moreover, the plate-shaped GaN crystal 133 had a high resistance and was semiinsulative.

The present inventors confirmed through experiments that the growth rate of the GaN crystal in the direction perpendicular to the c-axis direction becomes higher when the Li is mixed into the solution 25.

Accordingly, it is possible to control the plate shape of the group III nitride crystal that is grown. In other words, since the group III nitride crystal can be grown in a plate shape, the plate-shaped group III nitride crystal itself can be used as a group III nitride substrate, thereby reducing the production cost of the group III nitride substrate.

Eleventh Embodiment

Figure 16B:
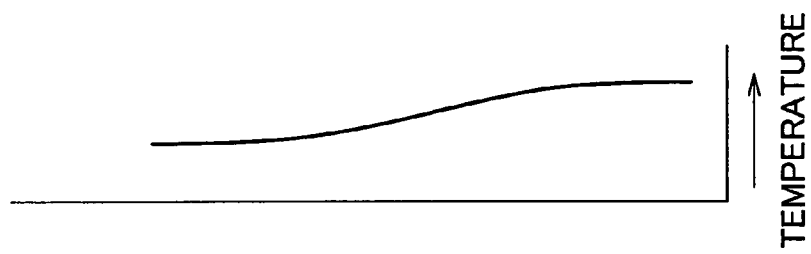
FIG. 16B is a diagram showing a temperature distribution within a reaction chamber of the group III nitride crystal growing apparatus shown in FIG. 16A along a vertical direction.
Figure 16A:
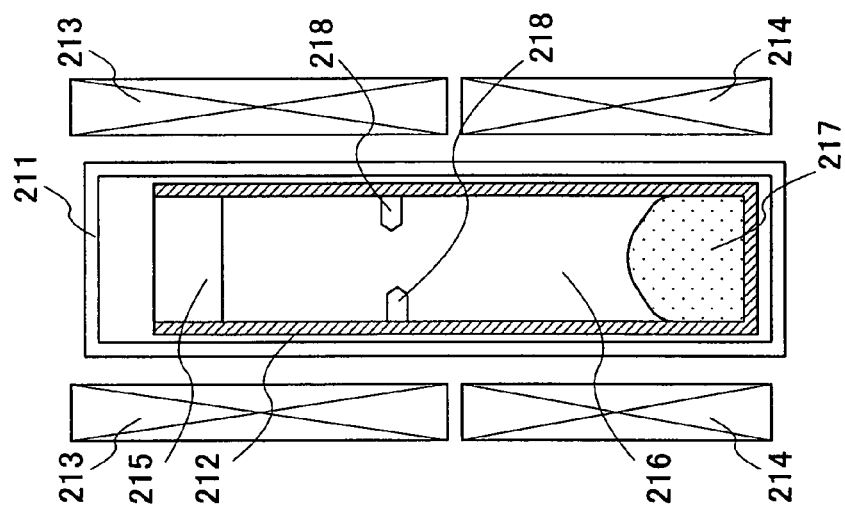
FIG. 16A is a cross sectional view showing an eleventh embodiment of the group III nitride crystal growing apparatus according to the present invention.

FIG. 16A is a cross sectional view showing an eleventh embodiment of the group III nitride crystal growing apparatus according to the present invention, and FIG. 16B is a diagram showing a temperature distribution within a reaction chamber of the group III nitride crystal growing apparatus shown in FIG. 16A along a vertical direction. In FIG. 16B, the ordinate indicates the distance along the vertical direction of the reaction chamber in arbitrary units, and the abscissa indicates the temperature in arbitrary units.

The group III nitride crystal growing apparatus shown in FIG. 16A includes a reaction chamber 211 which is made of stainless steel and has a closed shape, and a solution container 212 which is accommodated within the reaction chamber 211. The solution container 212 contains a solution 216 which includes an alkaline metal and is used to grow the group III nitride crystal. The solution container 212 may be removed from the reaction chamber 211. In this embodiment, the solution container 212 is made of BN.

An upper heater 213 and a lower heater 214 are provided on the outer side of the reaction chamber 211. Each of the upper and lower heaters 213 and 214 can be controlled to an arbitrary temperature.

The reaction chamber 211 can be removed from the group III nitride crystal growing apparatus. Hence, the reaction chamber 211 may be placed within a glove box without releasing the inside of the reaction chamber 211 to the atmosphere, and it is possible to work on the reaction chamber 211 within the glove box, such as preparing and setting a raw material within a high purity Ar gas atmosphere within the glove box. For this reason, it is possible to prevent moisture and impurities in the atmosphere from entering the reaction chamber 211, so that a high-quality group III nitride crystal can be grown.

Next, a description will be given of an eleventh embodiment of the method of growing the group III nitride crystal according to the present invention, which grows GaN, by the group III nitride crystal growing apparatus shown in FIG. 16A.

First, the reaction chamber 211 is removed from the group III nitride crystal growing apparatus, and placed within a glove box (not shown) having an Ar atmosphere. Then, a GaN raw material 217 is supplied to the solution container 212 as a group III nitride raw material, and a solution 216 including Na as an alkaline metal is supplied to the solution container 212. The solution container 212 is set within the reaction chamber 211, and the reaction chamber 211 is sealed, so as to shut off the inside of the reaction chamber 211 from external atmosphere. The series of operations are carried out within the glove box having the high purity Ar gas atmosphere, and thus, the inside of the reaction chamber 211 is filled with the Ar gas.

Next, the reaction chamber 211 is removed from the glove box and assembled into the group III nitride crystal growing apparatus. In other words, the reaction chamber 211 is set at a predetermined position where the upper and lower heaters 213 and 214 are provided. The upper and lower heaters 213 and 214 are turned ON to raise the temperature of the reaction chamber 211 to a predetermined crystal growing temperature. More particularly, the lower heater 214 is set to a dissolving temperature of the GaN raw material 217, and the upper heater 213 is set to a crystal growing temperature at which the GaN recrystallizes and is lower than a portion where the GaN raw material 217 exists. In this embodiment, the temperature of the portion where the GaN raw material 217 exists is set to 850° C., and the crystal growing temperature of the portion where the crystal growth takes place is set to 775° C.

The above described state is maintained for 500 hours, before decreasing the temperature of the reaction chamber 211 to the room temperature. When the reaction chamber 211 was opened after reducing the gas pressure within the reaction chamber 211, it was found that several colorless transparent GaN single crystals 218 having a length of approximately 3 mm were grown in a recrystallization temperature region within the solution container 212.

Twelfth Embodiment

Figure 17B:
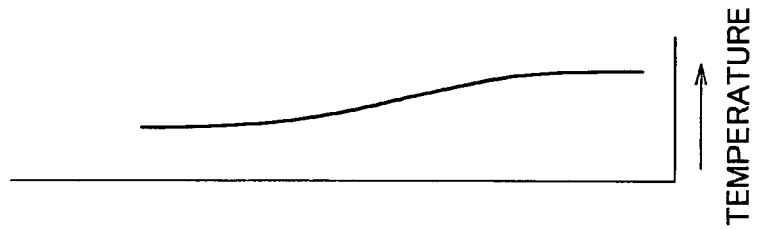
FIG. 17B is a diagram showing a temperature distribution within a reaction chamber of the group III nitride crystal growing apparatus shown in FIG. 17A along a vertical direction.
Figure 17A:
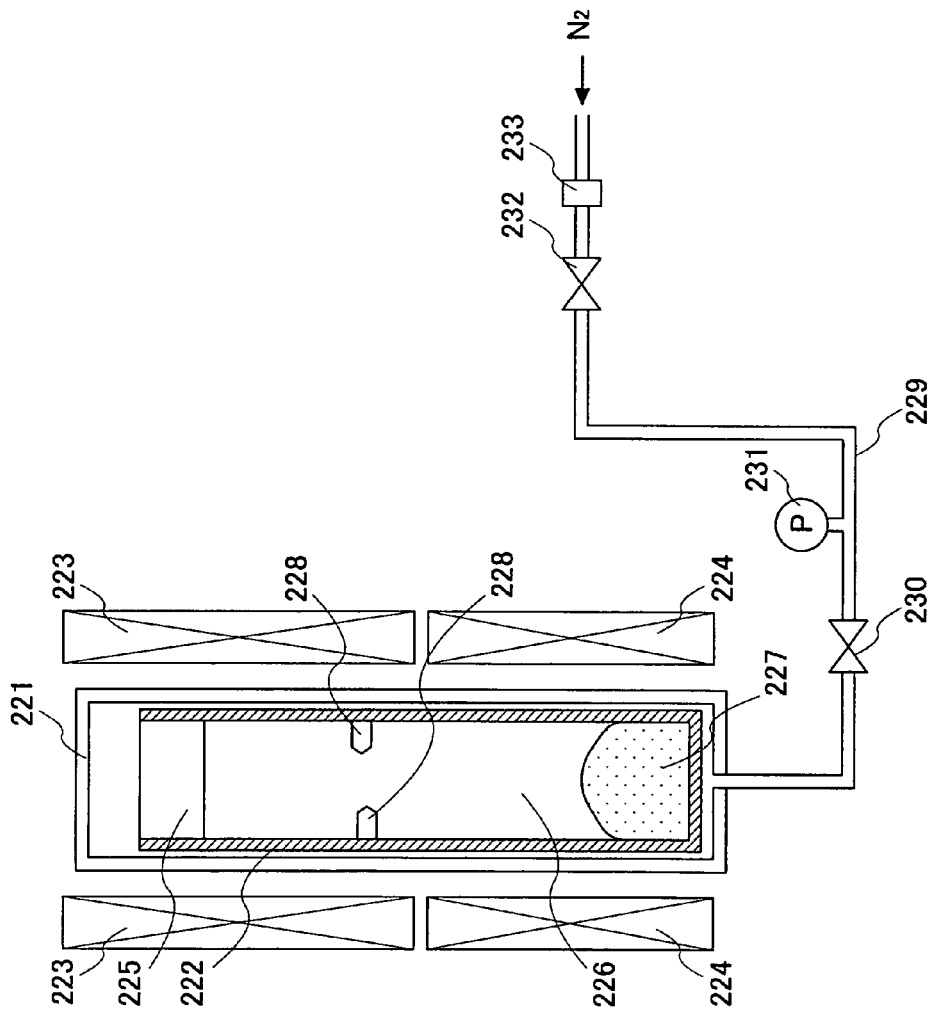
FIG. 17A is a cross sectional view showing a twelfth embodiment of the group III nitride crystal growing apparatus according to the present invention.

FIG. 17A is a cross sectional view showing a twelfth embodiment of the group III nitride crystal growing apparatus according to the present invention, and FIG. 17B is a diagram showing a temperature distribution within a reaction chamber of the group III nitride crystal growing apparatus shown in FIG. 17A along a vertical direction. In FIG. 17B, the ordinate indicates the distance along the vertical direction of the reaction chamber in arbitrary units, and the abscissa indicates the temperature in arbitrary units.

The group III nitride crystal growing apparatus shown in FIG. 17A includes a reaction chamber 221 which is made of stainless steel and has a closed shape, and a solution container 222 which is accommodated within the reaction chamber 221. The solution container 222 contains a solution 226 which includes an alkaline metal and is used to grow the group III nitride crystal. The solution container 222 may be removed from the reaction chamber 221. In this embodiment, the solution container 222 is made of BN.

An upper heater 223 and a lower heater 224 are provided on the outer side of the reaction chamber 221. Each of the upper and lower heaters 223 and 224 can be controlled to an arbitrary temperature.

The reaction chamber 221 can be removed from the group III nitride crystal growing apparatus. Hence, the reaction chamber 221 may be placed within a glove box without releasing the inside of the reaction chamber 221 to the atmosphere, and it is possible to work on the reaction chamber 221 within the glove box, such as preparing and setting a raw material within a high purity Ar gas atmosphere within the glove box. For this reason, it is possible to prevent moisture and impurities in the atmosphere from entering the reaction chamber 221, so that a high-quality group III nitride crystal can be grown.

Next, a description will be given of a twelfth embodiment of the method of growing the group III nitride crystal according to the present invention, which grows GaN, by the group III nitride crystal growing apparatus shown in FIG. 17A.

First, the reaction chamber 221 is removed from the group III nitride crystal growing apparatus at a valve 230, and placed within a glove box (not shown) having an Ar atmosphere. Then, a GaN raw material 227 is supplied to the solution container 222 as a group III nitride raw material, and a solution 226 including Na as an alkaline metal is supplied to the solution container 222. The solution container 222 is set within the reaction chamber 221, and the reaction chamber 221 is sealed, so as to shut off the inside of the reaction chamber 221 from external atmosphere. The series of operations are carried out within the glove box having the high purity Ar gas atmosphere, and thus, the inside of the reaction chamber 221 is filled with the Ar gas.

Next, the reaction chamber 221 is removed from the glove box and assembled into the group III nitride crystal growing apparatus. In other words, the reaction chamber 221 is set at a predetermined position where the upper and lower heaters 223 and 224 are provided, and connected at the valve 230 to a $N_2$ gas supply pipe 229. The upper and lower heaters 223 and 224 are turned ON to raise the temperature of the reaction chamber 221 to a predetermined crystal growing temperature. More particularly, the lower heater 224 is set to a dissolving temperature of the GaN raw material 227, and the upper heater 223 is set to a crystal growing temperature at which the GaN recrystallizes and is lower than a portion where the GaN raw material 227 exists. In this embodiment, the temperature of the portion where the GaN raw material 227 exists is set to 850° C., and the crystal growing temperature of the portion where the crystal growth takes place is set to 775° C.

The valve 230 and a valve 232 are opened to supply the $N_2$ gas from the $N_2$ gas supply pipe 229 to the reaction chamber 221. The pressure of the $N_2$ gas is monitored by a pressure gage 231, and controlled by a pressure control unit 232. Hence, the pressure of the $N_2$ gas is adjusted by the pressure control unit 232 so that the total pressure within the reaction chamber 221 becomes 4 MPa.

The above described state is maintained for 500 hours, before decreasing the temperature of the reaction chamber 221 to the room temperature. When the reaction chamber 221 was opened after reducing the gas pressure within the reaction chamber 221, it was found that several colorless transparent GaN single crystals 228 having a length of approximately 5 mm were grown in a recrystallization temperature region within the solution container 222.

Thirteenth Embodiment

Figure 18B:
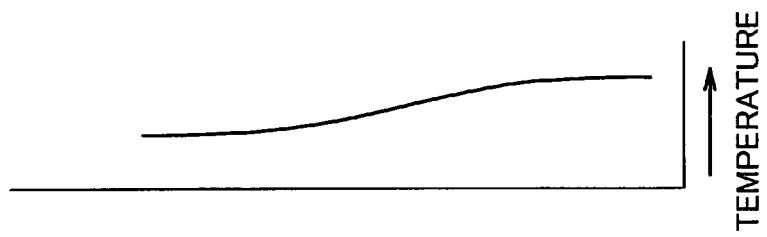
FIG. 18B is a diagram showing a temperature distribution within a reaction chamber of the group III nitride crystal growing apparatus shown in FIG. 18A along a vertical direction.
Figure 18A:
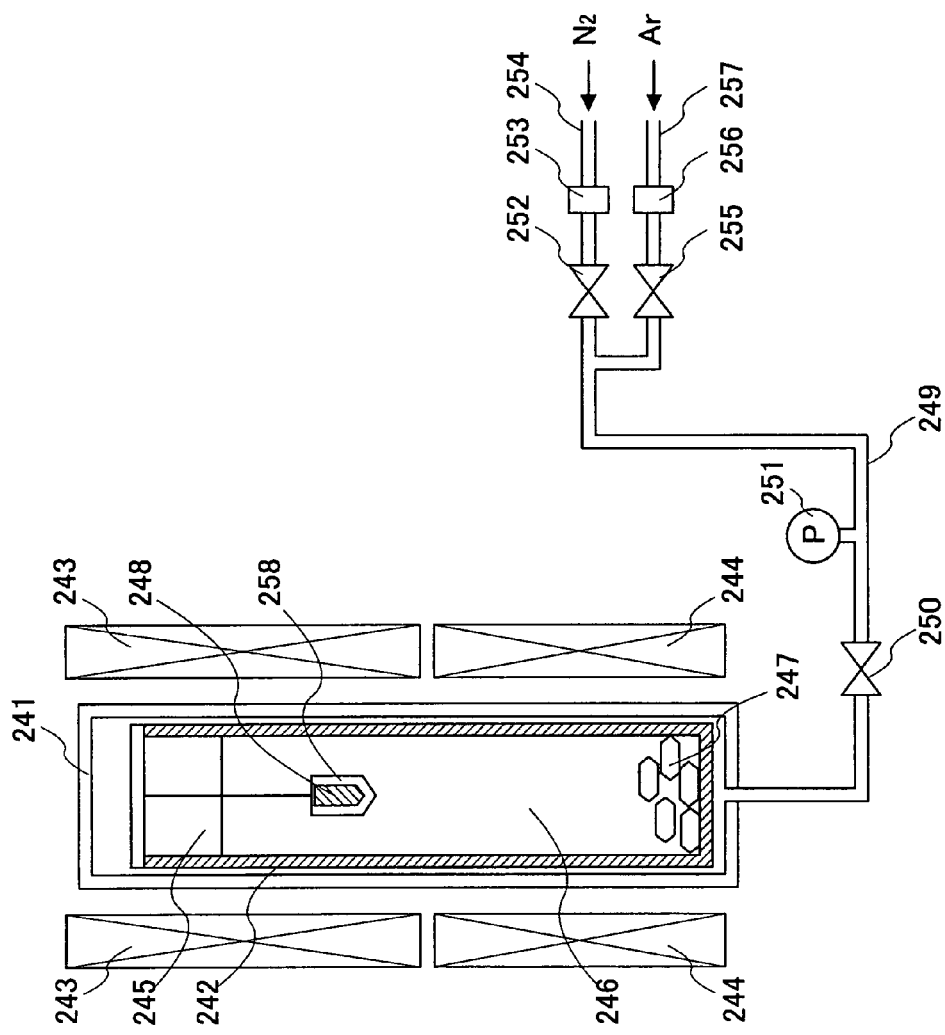
FIG. 18A is a cross sectional view showing a thirteenth embodiment of the group III nitride crystal growing apparatus according to the present invention.

FIG. 18A is a cross sectional view showing a thirteenth embodiment of the group III nitride crystal growing apparatus according to the present invention, and FIG. 18B is a diagram showing a temperature distribution within a reaction chamber of the group III nitride crystal growing apparatus shown in FIG. 18A along a vertical direction. In FIG. 18B, the ordinate indicates the distance along the vertical direction of the reaction chamber in arbitrary units, and the abscissa indicates the temperature in arbitrary units.

The group III nitride crystal growing apparatus shown in FIG. 18A includes a reaction chamber 241 which is made of stainless steel and has a closed shape, and a solution container 242 which is accommodated within the reaction chamber 241. The solution container 242 contains a solution 246 which includes an alkaline metal and is used to grow the group III nitride crystal. The solution container 242 may be removed from the reaction chamber 241. In this embodiment, the solution container 242 is made of BN.

A gas supply pipe 249 is connected to the reaction chamber 241, so that an internal space 245 within the reaction chamber 241 may be filled with $N_2$ gas and Ar gas for suppressing evaporation of an alkaline metal. The $N_2$ gas pressure and the Ar gas pressure within the reaction chamber 241 are controllable.

The gas supply pipe 249 branches to a $N_2$ gas supply pipe 254 via a valve 252, and branches to an Ar gas supply pipe 257 via a valve 255. The pressure within the $N_2$ gas supply pipe 254 is controllable by a pressure control unit 253, and the pressure within the Ar gas supply pipe 257 is controllable by a pressure control unit 256.

The total pressure within the reaction chamber is monitored by a pressure gage 251 which is provided on the gas supply pipe 249. The Ar gas is mixed as an inert gas in order to suppress evaporation of the alkaline metal and to independently control the pressure of the $N_2$ gas. Hence, a crystal growth with a high controllability is achieved.

An upper heater 243 and a lower heater 244 are provided on the outer side of the reaction chamber 241. Each of the upper and lower heaters 243 and 244 can be controlled to an arbitrary temperature.

The reaction chamber 241 can be removed from the group III nitride crystal growing apparatus. Hence, the reaction chamber 241 may be placed within a glove box without releasing the inside of the reaction chamber 241 to the atmosphere, and it is possible to work on the reaction chamber 241 within the glove box, such as preparing and setting a raw material within a high purity Ar gas atmosphere within the glove box. For this reason, it is possible to prevent moisture and impurities in the atmosphere from entering the reaction chamber 241, so that a high-quality group III nitride crystal can be grown.

Next, a description will be given of a thirteenth embodiment of the method of growing the group III nitride crystal according to the present invention, which grows GaN, by the group III nitride crystal growing apparatus shown in FIG. 18A.

First, the reaction chamber 241 is removed from the group III nitride crystal growing apparatus at a valve 250, and placed within a glove box (not shown) having an Ar atmosphere. Then, a GaN raw material 247 is supplied to the solution container 242 as a group III nitride raw material, and a solution 246 including Na as the alkaline metal is supplied to the solution container 242. In this embodiment, plate-shaped crystals having an approximately stoichiometry composition, grown within a molten mixture of Na and Ga under a $N_2$ pressure of 5 MPa, were used as the GaN raw material 247.

Thereafter, the Na within the solution container 242 is fused, and a GaN seed crystal 248 is hanged from an upper portion of the solution container 242 and held at a predetermined position within a Na solution 246. The solution container 242 is set within the reaction chamber 241, and the reaction chamber 241 is sealed, so as to shut off the inside of the reaction chamber 241 from external atmosphere. The series of operations are carried out within the glove box having the high purity Ar gas atmosphere, and thus, the inside of the reaction chamber 241 is filled with the Ar gas.

Next, the reaction chamber 241 is removed from the glove box and assembled into the group III nitride crystal growing apparatus. In other words, the reaction chamber 241 is set at a predetermined position where the upper and lower heaters 243 and 244 are provided, and connected at the valve 250 to the gas supply pipe 249. The upper and lower heaters 243 and 244 are turned ON to raise the temperature of the reaction chamber 241 to a predetermined crystal growing temperature. More particularly, the lower heater 244 is set to a dissolving temperature of the GaN raw material 247, and the upper heater 243 is set to a crystal growing temperature at which the GaN seed crystal 248 grows and is lower than a portion where the GaN raw material 247 exists. In this embodiment, the temperature of the portion where the GaN raw material 247 exists is set to 850° C., and the crystal growing temperature of the portion where the crystal growth of the GaN seed crystal 248 takes place is set to 775° C.

The valve 250 and the valve 255 are opened to supply the Ar gas from the Ar gas supply pipe 257, and the pressure is controlled by the pressure control unit 256 to control the total pressure within the reaction chamber 241 to 4 MPa, before closing the valve 255. Then, the valve 252 is opened to supply the $N_2$ gas from the $N_2$ gas supply pipe 254, and the pressure is controlled by the pressure control unit 253 to control the total pressure within the reaction chamber 241 to 8 MPa. In other words, the Ar partial pressure and the $N_2$ partial pressure in the internal space 245 within the reaction chamber 241 are respectively set to 4 MPa.

The above described state is maintained for 500 hours, before decreasing the temperature of the reaction chamber 241 to the room temperature. When the reaction chamber 241 was opened after reducing the gas pressure within the reaction chamber 241, it was found that a colorless transparent GaN single crystal 258 having a length of approximately 10 mm was grown on the GaN seed crystal 248 within the solution container 242.

Therefore, according to the eleventh through thirteenth embodiments, the method of growing a group III nitride crystal, comprises dissolving a group III nitride into a solution including an alkaline metal, and recrystallizing a group III nitride crystal at a location different from a location where the group III nitride is dissolved within the solution. In other words, when the group III nitride is held at a predetermined temperature within the solution which includes the alkaline metal, the group III nitride dissolves into the solution with a certain solubility. The dissolved group III nitride recrystallizes at a location where the supersaturation becomes large, such as a location where the temperature is low and a location where the nitrogen concentration is high. Hence, the group III nitride raw material is dissolved to recrystallize and grow the group III nitride crystal.

The group III nitride may be selected from group III metals such as Ga, Al and In. In addition, the group III nitride may be selected from compounds of nitrogen and one or a plurality of such group III metals. On the other hand, the alkaline metal may be selected from Na, K or other suitable alkaline metals. It is possible to dissolve another material within the solution which includes the alkaline metal. For example, the solution which includes the alkaline metal may be doped by fusing an n-type impurity or a p-type impurity.

According to the eleventh through thirteenth embodiments, the raw material required for the crystal growth is stably supplied without the possibility of clogging the supply pipe, and a practically large group III nitride crystal having a high quality can be grown.

It is desirable that the solution contacts the $N_2$ gas. In other words, the solution into which the group III nitride is dissolved, desirably contacts the $N_2$ gas having a predetermined partial pressure at a gas-liquid interface. When the group III nitride dissolves into the solution, the nitrogen generated by the decomposition of the group III nitride assumes a gaseous state and the nitrogen concentration within the solution decreases. Accordingly, the amount of nitrogen raw material becomes insufficient compared to the group III raw material. For this reason, the predetermined $N_2$ partial pressure is applied on the solution and the $N_2$ partial pressure is adjusted, so as to present lack of the nitrogen raw material. In addition, by controlling the nitrogen concentration within the solution, it is possible to control the crystal growth rate and the crystal quality when growing the group III nitride crystal.

Therefore, when the solution which includes the alkaline metal contacts the $N_2$ gas, it is possible to suppress escaping of the nitrogen from the solution, to thereby prevent the lack of the nitrogen raw material and grow a high-quality group III nitride crystal. In addition, it is possible to control the nitrogen concentration within the solution by controlling the $N_2$ partial pressure in the vapor phase, and the group III nitride crystal can be grown by controlling the crystal growth rate and the crystal quality. Consequently, it is possible to grow a practically large group III nitride crystal having a high quality.

The group III nitride which is dissolved into the solution may comprise plate-shaped crystals. Since the plate-shaped crystals more easily dissolve into the solution which includes the alkaline metal as compared to columnar crystals, the dissolving rate of the group III nitride is high, thereby enabling a stable supply of the raw material required for the recrystallization. As a result, it is possible to grow a practically large group III nitride crystal having a high quality.

The group III nitride which is dissolved into the solution may comprise an approximately stoichiometry composition. If the group III nitride raw material greatly deviates from the stoichiometry composition, the crystal growth rate may decrease and the grown crystal may deviate from the stoichiometry composition to deteriorate the crystal quality. Accordingly, by dissolving the group III nitride having an approximately stoichiometry composition into the solution which includes the alkaline metal, it is possible recrystallize and grow the group III nitride crystal having an approximately stoichiometry composition.

The group III nitride which is dissolved into the solution may comprise group III nitride crystals which are grown from a material which comprises nitrogen and a mixture of an alkaline metal and a group III metal. In this case, the nitrogen defect can be reduced, and it is possible to grow a high purity group III nitride crystal having an approximately stoichiometry composition. As a result, it is possible to grow a practically large group III nitride crystal having a high quality.

The group III nitride crystal may be grown on a seed crystal. In this case, it is possible to grow a practically large group III nitride crystal having a high quality.

Fourteenth Embodiment

A fourteenth embodiment of the method of growing the group III nitride crystal forms, within a reaction chamber, a molten mixture of an alkaline metal and a material which includes a group III metal, grows a group III nitride crystal which is made of the group III metal and nitrogen, from the molten mixture and a material which includes the nitrogen, and controls a temperature in a vicinity of a surface of the molten mixture and a temperature of a crystal growing region within the molten mixture, so that the nitrogen dissolves into the molten mixture from the surface and the group III nitride crystal grows in the crystal growing region which is other than the surface.

The group III metal may be selected from Ga, Al, In and the like. In addition, the alkaline metal may be selected from K, Na and the like. In addition, the material which includes nitrogen may be any suitable compound including nitrogen, such as nitrogen ($N_2$) gas, sodium azide ($NaN_3$), and ammonia ($NH_3$).

As long as the temperature in the vicinity of the surface of the molten mixture and the temperature of the crystal growing region are controlled, the two temperatures may be the same or mutually different temperatures.

Therefore, it is possible to grow a large group III nitride crystal under a crystal growing temperature condition that generates no nucleus of the group III nitride crystal in the vicinity of the surface of the molten mixture, that is, by growing the group III nitride crystal in the crystal growing region which is other than the surface of the molten mixture.

Figure 19:
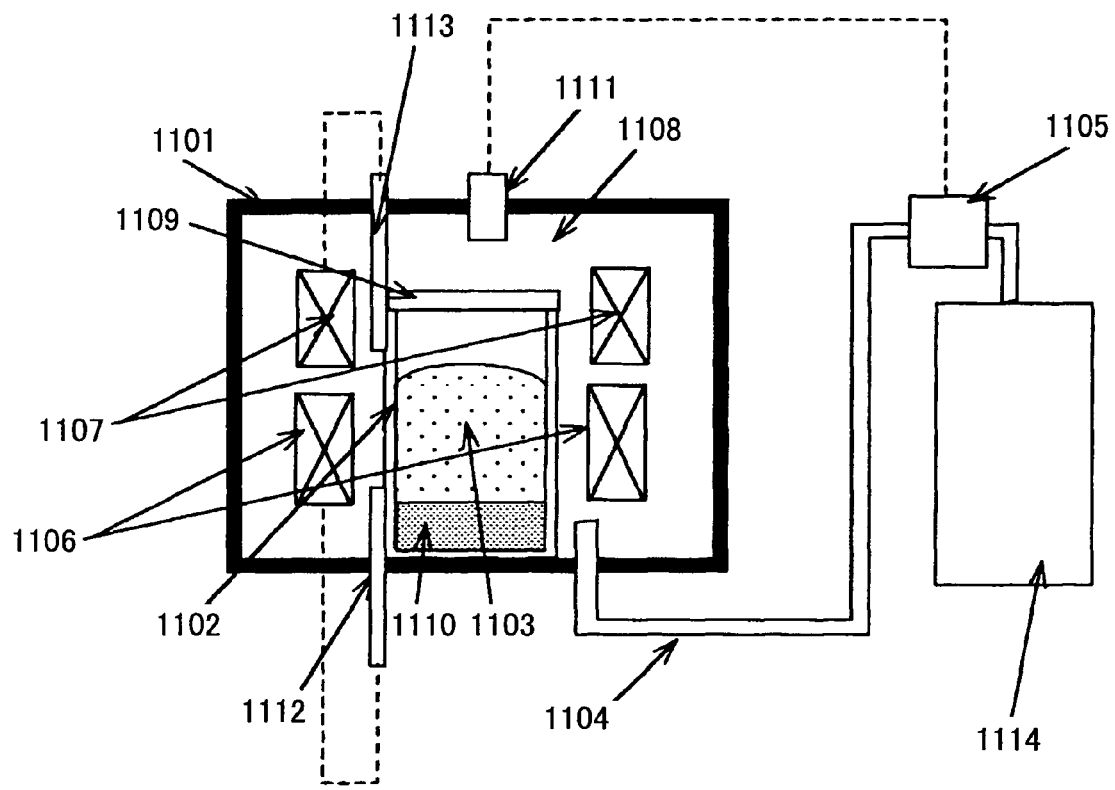
FIG. 19 is a cross sectional view showing a fourteenth embodiment of the group III nitride crystal growing apparatus according to the present invention.

FIG. 19 is a cross sectional view showing a fourteenth embodiment of the group III nitride crystal growing apparatus according to the present invention. The group III nitride crystal growing apparatus shown in FIG. 19 includes a reaction chamber 1101, and a solution container 1102 which is provided within the reaction chamber 1101. The solution container 1102 contains a molten mixture 1103 which includes Ga and Na. In this embodiment, the Ga is used as the material which includes the group III metal, and the Na is used as the alkaline metal. The alkaline metal, namely, the Na, may be supplied from outside the reaction chamber 1101 or, initially provided within the solution container 1102.

A lid 1109 is provided on top of the solution container 1102, and a gap is provided between the solution container 1102 and the lid 109 for allowing gas input and output with respect to the solution container 1102. The reaction chamber 1101 is made of stainless steel, for example. On the other hand, the solution container 1102 is made of BN, AlN or pyrolitic BN.

A first heater 1106 and a second heater 1107 are provided on the outer side of the solution container 1102, so that the group III nitride (GaN) may be controlled to the crystal growing temperature. The first heater 1106 is disposed under the second heater 1107, so that the second heater 1107 mainly heats the upper portion of the solution container 1102 and the first heater 1106 mainly heats the lower portion of the solution container 1102.

A first temperature sensor 1112 for detecting the temperature at the lower portion of the solution container 1102 is provided at the lower portion of the solution container 1102. A second temperature sensor 1113 for detecting the temperature at the upper portion of the solution container 1102 is provided at the upper portion of the solution container 1102. An output of the first temperature sensor 1112 is coupled to the first heater 1106 to enable a feedback control of the first heater 1106, so that the lower portion of the solution container 1102 is controlled to a desired temperature. Similarly, an output of the second temperature sensor 1113 is coupled to the second heater 1107 to enable a feedback control of the second heater 1107, so that the upper portion of the solution container 1102 is controlled to a desired temperature.

The material which includes nitrogen may be $N_2$ gas. In FIG. 19, a $N_2$ gas container 1114 which contains the $N_2$ gas is provided outside the reaction chamber 1101. The $N_2$ gas from the $N_2$ gas container 1114 can be supplied to a space 1108 within the reaction chamber 1101 via a gas supply pipe 1104. In this embodiment, the $N_2$ gas is supplied from a lower portion of the reaction chamber 1101. In order to adjust the pressure of the $N_2$ gas, a pressure gage 1111 is provided to detect the pressure of the $N_2$ gas within the reaction chamber 1101, and a pressure adjusting valve 1105 is provided to adjust the pressure of the $N_2$ gas via the gas supply pipe 1104. An output of the pressure gage 1111 is coupled to the pressure adjusting valve 1105 to enable a feedback control of the pressure adjusting valve 1105, so that the pressure within the reaction chamber 1101 is controlled to a desired pressure.

In this embodiment, the $N_2$ pressure within the reaction chamber 1101 is set to 3 MPa, the temperature at the upper portion of the solution container 1102 is set to 1000° C., the temperature at the lower portion of the solution container 1102 is set to 850° C., and a seed crystal is initially set in the lower portion of the solution container 1102. In this state, the above described pressure and temperatures are maintained, so that a GaN crystal 1110 grows on the nucleus of the seed crystal.

The GaN crystal 1110 does not grow at the surface of the molten mixture 1103, and the GaN crystal 1110 grows only in the crystal growing region at the lower portion of the solution container 1102 where the seed crystal is set. The nitrogen dissolves into the molten mixture 1103 from the surface of the molten mixture 1103, and the GaN crystal 1110 grows only in the crystal growing region where the seed crystal is set.

Because the crystal growth does not occur at the surface of the molten mixture 1103 and the crystal growth occurs only in the intended crystal growing region, the raw material is efficiently utilized, and a high-quality GaN crystal can be grown by controlling the generation of the nucleus of the GaN.

Figure 20:
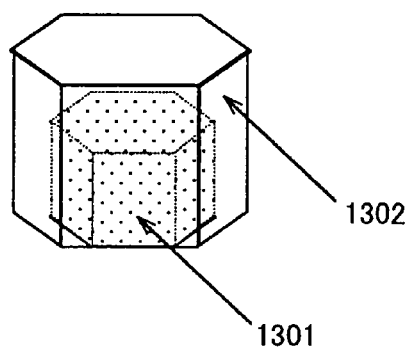
FIG. 20 is a perspective view showing a columnar GaN crystal which is obtained by growing the GaN crystal by the group III nitride crystal growing apparatus shown in FIG. 19.

FIG. 20 is a perspective view showing a columnar GaN crystal which is obtained by growing the GaN crystal by the group III nitride crystal growing apparatus shown in FIG. 19.

When a GaN crystal 1301 shown in FIG. 20 is set as the seed crystal at the lower portion of the solution container 1102, the GaN crystal grows on the GaN seed crystal 1301 by maintaining the crystal growth conditions described above, and a columnar GaN crystal 1302 is obtained.

The GaN seed crystal 1301 has a hexagonal column shape, and thus, a hexagonal columnar GaN crystal 1302 is grown on the GaN seed crystal 1301. In FIG. 20, top and bottom surfaces of the hexagonal column shape are the c-plane.

Figure 21:
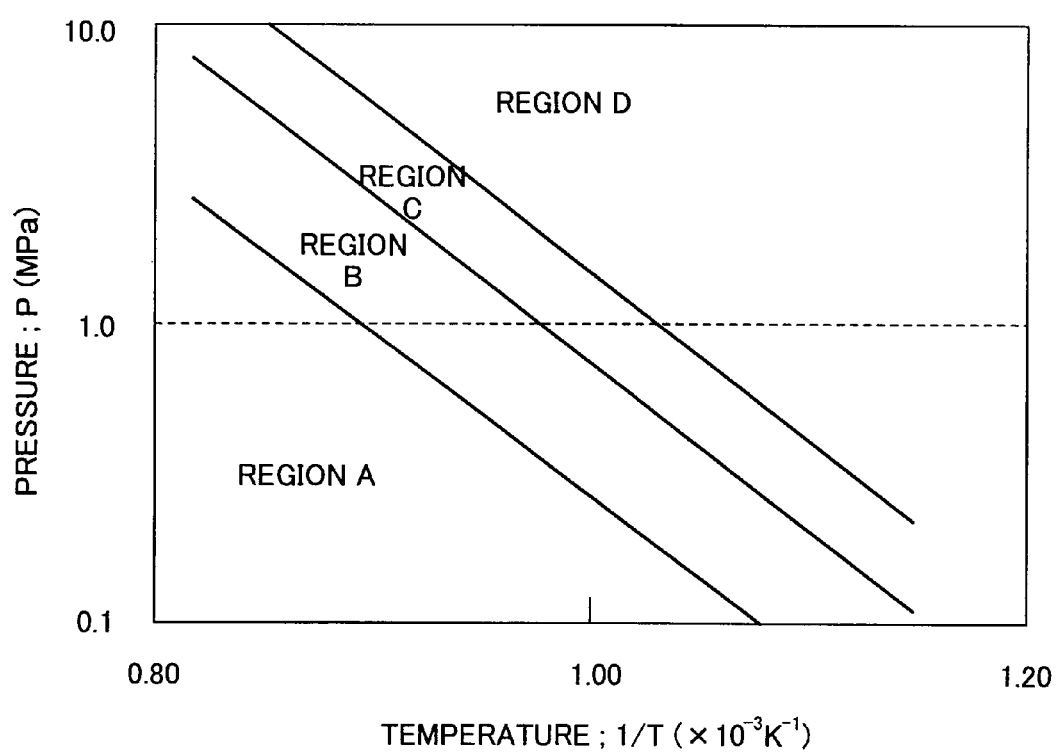
FIG. 21 is a diagram showing a relationship between a crystal growing temperature and a crystal growing pressure for the group III nitride crystal.

FIG. 21 is a diagram showing a relationship between a crystal growing temperature and a crystal growing pressure for the group III nitride crystal. In FIG. 21, the ordinate indicates the $N_2$ pressure (P) within the reaction chamber 1101 in MPa, and the abscissa indicates the inverse of the absolute temperature (1/T) of the molten mixture 1103 in "×10⁻³K⁻¹". Different crystal forms are obtain in four regions A, B, C and D shown in FIG. 21.

In the region A, no group III nitride crystal grows and the group III nitride crystal decomposes. In the region B, the group III nitride crystal grows only on the seed crystal, and no group III nitride crystal grows on the inner walls or the like of the solution container 1102 (or reaction chamber 1101). In the regions C and D, the nucleus of the group III nitride is naturally generated, and the group III nitride crystal also grows on the inner walls and the like of the solution container 1102 (or reaction chamber 1101). The columnar crystal grows dominantly in the region C, while the plate-shaped crystal grows dominantly in the region D.

In this embodiment, the temperature and pressure at the surface of the molten mixture 1103 correspond to those in the region A shown in FIG. 21. On the other hand, the temperature and pressure at the lower portion of the solution container 1102 where the seed crystal is set correspond to those in the region B shown in FIG. 21.

Because the crystal growth occurs dominantly on the seed crystal in the region B shown in FIG. 21, the crystal growth is unlikely to newly occur in regions other than that of the seed crystal, thereby enabling efficient utilization of the raw material. In other words, virtually all of the raw material is used by the GaN crystal which grows on the seed crystal, and the Ga which is initially prepared and set in the solution container 1102 is efficiently utilized. As a result, it is possible to grow a large GaN crystal without having to use a large amount of Ga.

In addition, the crystal orientation of the group III nitride crystal can easily be controlled, because the group III nitride crystal can be grown on the seed crystal. In other words, by using as the seed crystal a GaN crystal or the like having a predetermined crystal orientation, it is possible to accurately control the crystal orientation of the group III nitride crystal which is grown. As a result, when finally slicing the group III nitride crystal which is obtained, it is possible to easily obtain the desired crystal orientation. Hence, a GaN substrate or the like can be obtained with the desired crystal orientation by slicing the GaN crystal which is obtained.

Therefore, according to this embodiment, it is possible to obtain a group III nitride crystal having a high quality and low defect density.

In FIG. 20, the GaN seed crystal 1301 used has the hexagonal column shape. However, the seed crystal may have other shapes, such as a plate-shape, as will be described later in conjunction with a sixteenth embodiment. Furthermore, the group III nitride crystal may be grown on an epitaxial layer. In this case, it is possible to obtain a large plate-shaped group III nitride crystal such as the GaN crystal.

Fifteenth Embodiment

A fifteenth embodiment of the method of growing the group III nitride crystal is based on the fourteenth embodiment described above, and fills a space within the reaction chamber by the material which includes the nitrogen and in a gaseous state, and controls a pressure within the reaction chamber so that a partial pressure of the material which includes the nitrogen and is in the gaseous state generates no nucleus of the group III nitride in the vicinity of the surface in response to a temperature change at the surface. The space within the reaction chamber may include a gas other than the material which includes the nitrogen.

The temperature and pressure at the surface of the molten mixture are set to those of the region A or B shown in FIG. 21, and temperature and pressure in the region other than the surface of the molten mixture are set to those of the region B or C or D shown in FIG. 21 so that the crystal growth occurs in the region.

The group III nitride crystal does not grow at the surface of the molten mixture, and the nitrogen dissolves into the molten mixture from the surface of the molten mixture. The nitrogen which dissolves into the molten mixture diffuses to the region other than the surface of the molten mixture, and the group III nitride crystal grows under the pressure and temperature conditions of the region B or C or D shown in FIG. 21.

Therefore, the pressure and the atmosphere can be controlled with ease according to this embodiment. Moreover, by setting the partial pressure of the material (gas) which includes the nitrogen to a constant value and generating a temperature change, it becomes easy to dissolve the nitrogen into the molten mixture from the surface of the molten mixture and to grow the group III nitride crystal in the region other than the surface of the molten mixture.

A fifteenth embodiment of the group III nitride crystal growing apparatus may have the same structure as that shown in FIG. 19, but operated under different conditions. In this embodiment, the N₂ pressure within the reaction chamber 1101 is set to 3 MPa, the temperature at the upper portion of the solution container 1102 is set to 1000° C., and the temperature at the lower portion of the solution container 1102 is set to 800° C. In this state, the above described pressure and temperatures are maintained, so that a GaN crystal 1110 grows at the lower portion of the solution container 1102.

Figure 22:
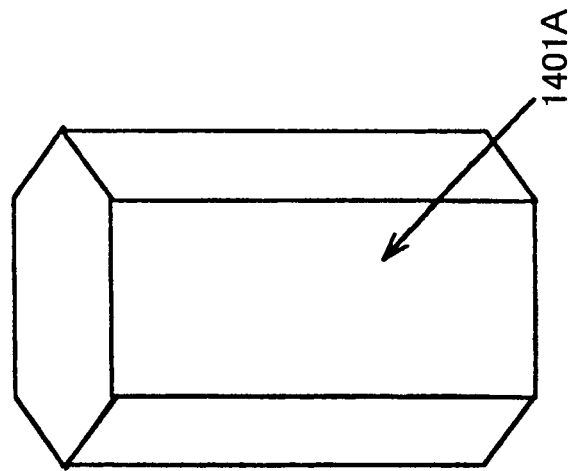
FIG. 22 is a perspective view showing a columnar GaN crystal which is obtained by growing the GaN crystal by a fifteenth embodiment of the method of growing the group III nitride crystal.

In this case, the GaN crystal 1110 does not grow at the surface of the molten mixture 1103, and the GaN crystal 1110 grows only at the lower portion of the solution container 1102. The nitrogen dissolves into the molten mixture 1103 from the surface of the molten mixture 1103, and the GaN crystal grows only at the lower portion of the solution container 1102. In this state, a columnar GaN crystal 1401A shown in FIG. 22 or a columnar GaN crystal 1401B shown in FIG. 23 grows dominantly at the lower portion of the solution container 1102. FIG. 22 is a perspective view showing the columnar GaN crystal 1401A which may be obtained by growing the GaN crystal by this fifteenth embodiment, and FIG. 23 is a perspective view showing the columnar GaN crystal 1401B which may be obtained by this embodiment.

Figure 23:
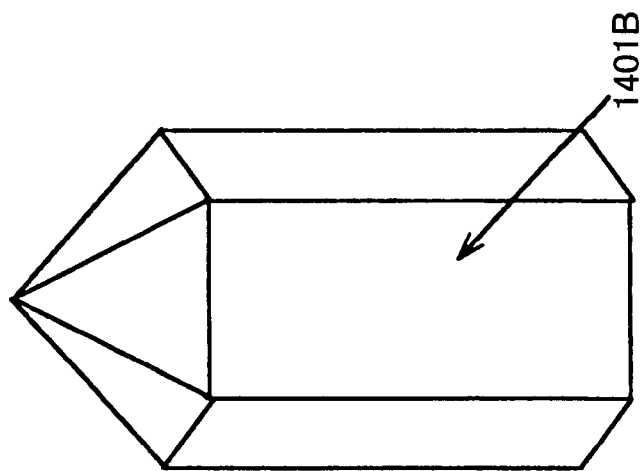
FIG. 23 is a perspective view showing a columnar GaN crystal which is obtained by growing the GaN crystal by the fifteenth embodiment of the method of growing the group III nitride crystal.

The columnar GaN crystal 1401A shown in FIG. 22 has a hexagonal column shape, while the columnar GaN crystal 1401B shown in FIG. 23 has shape which is a combination of a hexagonal column shape with a hexagonal pyramid shape on top. In FIGS. 22 and 23, bottom surfaces of the hexagonal column shapes of the columnar GaN crystals 1401A and 1401B are the c-plane. In other words, the columnar GaN crystals 1401A and 1401B shown in FIGS. 22 and 23 extend in the c-axis direction.

Since this embodiment does not grow the GaN crystal at the surface of the molten mixture 1103 and grows the GaN crystal only in the predetermined intended region, the raw material is efficiently utilized, and a high-quality GaN crystal can be grown by controlling the nucleus generation.

In this embodiment, the temperature and pressure at the surface of the molten mixture 1103 correspond to those of the region A shown in FIG. 21, and the temperature and pressure at the lower portion of the molten mixture 1103 where the GaN crystal grows correspond to those of the region C shown in FIG. 21.

Because the columnar GaN crystal grows dominantly in the region C shown in FIG. 21, the crystal orientation is definite. Hence, when making a GaN substrate from the columnar GaN crystal, it is easy to determine the crystal orientation and the slicing of the columnar GaN crystal.

In addition, since the columnar GaN crystal grows from the natural nucleus generation in the region C shown in FIG. 21, even when there is no seed crystal, it is possible to use the columnar GaN crystal which is grown in the region C as the seed crystal which is used in the region B.

Sixteenth Embodiment

A sixteenth embodiment of the method of growing the group III nitride crystal is based on the fourteenth embodiment described above, and the temperature in the vicinity of the surface of the molten mixture is controlled to a temperature which is higher than the temperature of the crystal growing region. In other words, the group III nitride crystal is grown in the region having a lower temperature than the surface of the molten mixture, and the group III nitride crystal is not grown at the surface of the molten mixture. The temperature is higher towards the left side along the abscissa in FIG. 21.

According to this embodiment, it is possible to set a large margin for the crystal growing conditions. That is, since the region A shown in FIG. 21 becomes the higher temperature region and it is easy to set the regions B, C and D as the lower temperature regions having a lower temperature than the region A, it is possible to set a large margin for the crystal growing conditions. As a result, it is possible to grow group III nitride crystals having various forms, as will be described later.

A sixteenth embodiment of the group III nitride crystal growing apparatus may have the same structure as that shown in FIG. 19, but operated under different conditions. In this embodiment, the $N_2$ pressure within the reaction chamber 1101 is set to 3 MPa, the temperature at the upper portion of the solution container 1102 is set to 1000° C., and the temperature at the lower portion of the solution container 1102 is set to 730° C. In this state, the above described pressure and temperatures are maintained, so that a GaN crystal 1110 grows at the lower portion of the solution container 1102.

Figure 24:
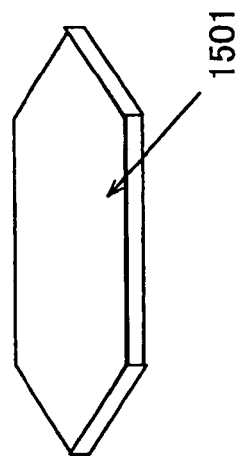
FIG. 24 is a perspective view showing a plate-shaped GaN crystal which is obtained by growing the GaN crystal by a sixteenth embodiment of the method of growing the group III nitride crystal.

In this case, the GaN crystal 1110 does not grow at the surface of the molten mixture 1103, and the GaN crystal 1110 grows only at the lower portion of the solution container 1102. The nitrogen dissolves into the molten mixture 1103 from the surface of the molten mixture 1103, and the GaN crystal grows only at the lower portion of the solution container 1102. In this state, a plate-shaped GaN crystal 1501 shown in FIG. 24 grows dominantly at the lower portion of the solution container 1102. FIG. 24 is a perspective view showing the plate-shaped GaN crystal 1501 which is obtained by growing the GaN crystal by this sixteenth embodiment.

The group III nitride crystal which is grown by this sixteenth embodiment is not limited to the hexagonal plate-shaped GaN crystal 1501 shown in FIG. 24, and group III nitride crystals having shapes other than the hexagonal plate shape may be grown. For example, a polygonal plate-shaped group III nitride crystal of the hexagonal system may be grown by this embodiment. In each case, the plate-shaped group III nitride crystal extends parallel to the (0001) face, that is, the c-plane.

Since this embodiment does not grow the GaN crystal at the surface of the molten mixture 1103 and grows the GaN crystal only in the predetermined intended region, the raw material is efficiently utilized, and a high-quality GaN crystal can be grown by controlling the nucleus generation.

In this embodiment, the temperature and pressure at the surface of the molten mixture 1103 correspond to those of the region A shown in FIG. 21, and the temperature and pressure at the lower portion of the molten mixture 1103 where the GaN crystal grows correspond to those of the region D shown in FIG. 21.

Because the plate-shaped GaN crystal grows dominantly in the region D shown in FIG. 21, the plate-shaped GaN crystal may be used as it is as a GaN substrate. Furthermore, even when undulations are formed on the surface of the plate-shaped GaN crystal, the surface undulations can be eliminated by simply polishing the crystal surface so that the plate-shaped GaN crystal may be used as the GaN substrate.

The crystal growth rate in the in-plane direction of the plate-shaped group III nitride crystal is high in the region D shown in FIG. 21. For this reason, the GaN crystal can be grown efficiently at a low cost.

In addition, since the plate-shaped GaN crystal grows from the natural nucleus generation in the region D shown in FIG. 21, even when there is no seed crystal, it is possible to use the plate-shaped GaN crystal which is grown in the region D as the seed crystal which is used in the region B.

Seventeenth Embodiment

A seventeenth embodiment of the method of growing the group III nitride crystal is based on the sixteenth embodiment described above, and sets a seed crystal in the crystal growing region, and controls the temperature and a pressure in the crystal growing region, so that the group III nitride crystal grows on the seed crystal.

More particularly, the temperature and pressure of the region where the seed crystal is set are controlled to be those of the region B shown in FIG. 21. On the other hand, the temperature and pressure at the surface of the molten mixture are controlled to be those of the region A shown in FIG. 21. Under these crystal growing conditions, the nitrogen dissolves into the molten mixture from the surface of the molten mixture, and the group III nitride crystal grows only on the seed crystal which is set in the region described above.

The seed crystal may be made of any group III nitride, as long as it functions as a seed crystal. Hence, the seed crystal may be made of the same material as the group III nitride crystal which grows in the molten mixture or, may be made of a material different from that of the group III nitride crystal which grows in the molten mixture. Although the group III nitride crystal grows on the seed crystal even when the seed crystal is made of the material which is different from that of the group III nitride crystal which grows in the molten mixture, it is desirable from the point of view of obtaining a high quality crystal that the seed crystal is made of the same material as the group III nitride crystal which grows in the molten mixture.

Since the group III nitride crystal does not grow at the surface of the molten mixture and grows only in the intended predetermined region of the molten mixture, the raw material is efficiently utilized, and a high-quality crystal can be grown by controlling the nucleus generation.

Because the crystal growth occurs dominantly on the seed crystal in the region B shown in FIG. 21, the crystal growth is unlikely to newly occur in regions other than that of the seed crystal, thereby enabling efficient utilization of the raw material. In other words, virtually all of the raw material is used by the group III nitride (GaN) crystal which grows on the seed crystal, and the group III metal (Ga) which is initially prepared and set in the solution container 1102 is efficiently utilized. As a result, it is possible to grow a large group III nitride (GaN) crystal without having to use a large amount of group III metal (Ga).

In addition, the crystal orientation of the group III nitride crystal can easily be controlled, because the group III nitride crystal can be grown on the seed crystal. In other words, by using as the seed crystal a GaN crystal or the like having a predetermined crystal orientation, it is possible to accurately control the crystal orientation of the group III nitride crystal which is grown. As a result, when finally slicing the group III nitride crystal which is obtained, it is possible to easily obtain the desired crystal orientation. Hence, a GaN substrate or the like can be obtained with the desired crystal orientation by slicing the GaN crystal which is obtained.

Therefore, according to this embodiment, it is possible to obtain a group III nitride crystal having a high quality and low defect density.

A seventeenth embodiment of the group III nitride crystal growing apparatus may have the same structure as that shown in FIG. 19, but operated under different conditions. In this embodiment, the $N_2$ pressure within the reaction chamber 1101 is set to 2 MPa, the temperature at the upper portion of the solution container 1102 is set to 850° C., and the temperature at the lower portion of the solution container 1102 is also set to 850° C. Further, a seed crystal is initially prepared and set in the lower portion of the solution container 1102. In this state, the above described pressure and temperatures are maintained, so that a GaN crystal 1110 grows at the lower portion of the solution container 1102 using the seed crystal as the nucleus.

Although the seed crystal is set in the lower portion of the solution container 1102, that is, the lower portion of the molten mixture 1103, it is of course possible to obtain similar effects by setting the seed crystal on the side wall or the like of the solution container 1102.

The effects obtainable in this embodiment are basically the same as those obtainable by the fourteenth embodiment described above, except that the temperatures of the upper and lower portions of the solution container 1102 are set to the same temperature in this embodiment. And since the temperatures at the upper and lower portions of the solution container 1102 are the same, the temperature of the entire molten mixture 1103 becomes uniform, and the thermal deviation becomes small, thereby making it possible to grow the group III nitride (GaN) crystal under stable crystal growing conditions.

Eighteenth Embodiment

An eighteenth embodiment of the method of growing the group III nitride crystal is based on the sixteenth embodiment described above, and controls the temperature and a pressure in the crystal growing region, so that a columnar group III nitride crystal grows in the crystal growing region.

More particularly, the temperature and pressure in the region within the molten mixture where the columnar group III nitride crystal grows are controlled to those of the region C shown in FIG. 21. On the other hand, the temperature and pressure at the surface of the molten mixture are controlled to those of the region A or B shown in FIG. 21. Hence, the group III nitride crystal does not grow at the surface of the molten mixture, and the nitrogen dissolves into the molten mixture from the surface of the molten mixture. In other words, the columnar group III nitride crystal grows because the temperature and pressure are controlled to those of the region C shown in FIG. 21 only in the region within the molten mixture where the columnar group III nitride crystal grows.

Since this embodiment does not grow the GaN crystal at the surface of the molten mixture 1103 and grows the GaN crystal only in the predetermined intended region, the raw material is efficiently utilized, and a high-quality GaN crystal can be grown by controlling the nucleus generation.

Moreover, because the columnar GaN crystal grows dominantly in the region C shown in FIG. 21, the crystal orientation is definite. Hence, when making a GaN substrate from the columnar GaN crystal, it is easy to determine the crystal orientation and the slicing of the columnar GaN crystal.

An eighteenth embodiment of the group III nitride crystal growing apparatus may have the same structure as that shown in FIG. 19, but operated under different conditions. In this embodiment, the $N_2$ pressure within the reaction chamber 1101 is set to 2 MPa, the temperature at the upper portion of the solution container 1102 is set to 800° C., and the temperature at the lower portion of the solution container 1102 is set to 850° C. Further, a seed crystal is initially prepared and set in the lower portion of the solution container 1102. In this state, the above described pressure and temperatures are maintained, so that a GaN crystal 1110 grows at the lower portion of the solution container 1102 using the seed crystal as the nucleus.

Although the seed crystal is set in the lower portion of the solution container 1102, that is, the lower portion of the molten mixture 1103, it is of course possible to obtain similar effects by setting the seed crystal on the side wall or the like of the solution container 1102.

The effects obtainable in this embodiment are basically the same as those obtainable by the fourteenth or seventeenth embodiment described above, except that the temperature of the upper portion of the solution container 1102 is lower than the temperature of the lower portion of the solution container 1102 in this embodiment. And since the temperatures at the upper and lower portions of the solution container 1102 are different, convection of the molten mixture 1103 occurs, thereby scattering the nitrogen which dissolves into the molten mixture 1103 from the surface of the molten mixture 1103, throughout the entire molten mixture 1103, to realize a uniform nitrogen concentration. As a result, it is possible to realize a stable growth of the GaN crystal.

Although $N_2$ gas is used as the material which includes nitrogen, it is also possible to supply to the reaction chamber 1101 other materials which include the nitrogen, such as sodium azide ($NaN_3$), and ammonia ($NH_3$) gas.

It is also possible to supply to the reaction chamber 1101 a gas mixture of the material which includes the nitrogen and an inert gas such as Ar gas, where the material which includes the nitrogen may be nitrogen ($N_2$) gas, sodium azide ($NaN_3$) or ammonia ($NH_3$) gas. The inert gas that is used does not react with the alkaline metal, the material which includes the group III metal or the material which includes the nitrogen.

Even in the case where the gas mixture of the material which includes the nitrogen (nitrogen ($N_2$) gas, sodium azide ($NaN_3$) or ammonia ($NH_3$) gas) and the inert gas (Ar gas) is supplied to the reaction chamber 1101, the pressure at which the group III nitride crystal is grown is determined by the effective $N_2$ gas pressure within the reaction chamber 1101, and not the total pressure of the gas mixture.

Nineteenth Embodiment

A nineteenth embodiment of the method of growing the group III nitride crystal is based on the sixteenth embodiment described above, and controls the temperature and a pressure in the crystal growing region, so that a plate-shaped group III nitride crystal grows in the crystal growing region.

More particularly, the temperature and pressure in the region within the molten mixture where the plate-shaped group III nitride crystal grows are controlled to those of the region D shown in FIG. 21. On the other hand, the temperature and pressure at the surface of the molten mixture are controlled to those of the region A or B shown in FIG. 21. Hence, the group III nitride crystal does not grow at the surface of the molten mixture, and the nitrogen dissolves into the molten mixture from the surface of the molten mixture. In other words, the plate-shaped group III nitride crystal grows because the temperature and pressure are controlled to those of the region D shown in FIG. 21 only in the region within the molten mixture where the plate-shaped group III nitride crystal grows.

Since this embodiment does not grow the GaN crystal at the surface of the molten mixture 1103 and grows the GaN crystal only in the predetermined intended region, the raw material is efficiently utilized, and a high-quality GaN crystal can be grown by controlling the nucleus generation.

Moreover, because the plate-shaped GaN crystal grows dominantly in the region D shown in FIG. 21, the plate-shaped GaN crystal may be used as it is as a GaN substrate. Furthermore, even when undulations are formed on the surface of the plate-shaped GaN crystal, the surface undulations can be eliminated by simply polishing the crystal surface so that the plate-shaped GaN crystal may be used as the GaN substrate.

The crystal growth rate in the in-plane direction of the plate-shaped group III nitride crystal is high in the region D shown in FIG. 21. For this reason, the GaN crystal can be grown efficiently at a low cost.

Twentieth Embodiment

A twentieth embodiment of the method of growing the group III nitride crystal is based on the sixteenth embodiment described above, and locates the crystal growing region in a lower portion of the reaction chamber.

The lower portion of the reaction chamber refers to a region which is lower than the surface of the molten mixture from which the nitrogen dissolves into the molten mixture.

According to this embodiment, a large group III nitride crystal can be grown continuously within the molten mixture. In other words, stable crystal growing conditions are obtained in the molten mixture, such as small temperature deviation and a constant ratio of raw materials, thereby making it possible to grow a large group III nitride crystal having a high quality.

Twenty-First Embodiment

A twenty-first embodiment of the method of growing the group III nitride crystal is based on the fourteenth embodiment described above, and controls the temperature in the vicinity of the surface of the molten mixture and the temperature of the crystal growing region to approximately same temperature.

More particularly, the temperature and pressure of the region within the molten mixture 1103 where the group III nitride crystal grows are set to those of the region B shown in FIG. 21, and the group III nitride crystal grows only on the seed crystal. Since the pressure of the material (gas) including nitrogen is approximately constant within the reaction chamber 1101, the temperature in the vicinity of the surface of the molten mixture 1103 and the temperature of the crystal growing region within the molten mixture 1103 may be regarded as being approximately the same as long as the temperatures are controlled within the temperature range of the region B shown in FIG. 21.

Therefore, according to this embodiment, the temperature within the entire molten mixture becomes uniform and the thermal deviation becomes small, because the temperature in the vicinity of the surface of the molten mixture and the temperature of the crystal growing region are controlled to approximately the same temperature. Hence, the group III nitride crystal can be grown under stable crystal growing conditions. As a result, it is possible to grow a large group III nitride crystal having a high quality.

Twenty-Second Embodiment

A twenty-second embodiment of the method of growing the group III nitride crystal is based on the fourteenth embodiment described above, and controls the temperature in the vicinity of the surface of the molten mixture to a temperature which is lower than a temperature at a lower portion of the molten mixture within the reaction chamber.

More particularly, the lower portion of the molten mixture 1103 refers to a portion lower than the vicinity of the surface of the molten mixture 1103. The temperature and pressure of the region within the molten mixture 1103 where the group III nitride crystal grows are set to those of the region B shown in FIG. 21, and the group III nitride crystal grows only on the seed crystal.

Therefore, according to this embodiment, convection is generated in the molten mixture, because the temperature in the vicinity of the surface of the molten mixture is controlled to be lower than the temperature of the lower portion of the molten mixture. Hence, the convection of the molten mixture scatters the nitrogen which dissolves into the molten mixture from the surface of the molten mixture, to make the nitrogen concentration uniform within the entire molten mixture. As a result, the group III nitride crystal can be grown under stable crystal growing conditions, and it is possible to grow a large group III nitride crystal having a high quality.

According to the fourteenth through twenty-second embodiments, it is possible to improve the positional controllability and the growth parameter controllability, and to efficiently dissolve the nitrogen into the molten mixture and to efficiently utilize the group III metal, so as to grow a large group III nitride crystal.

Embodiments of Semiconductor Device

Figure 25:
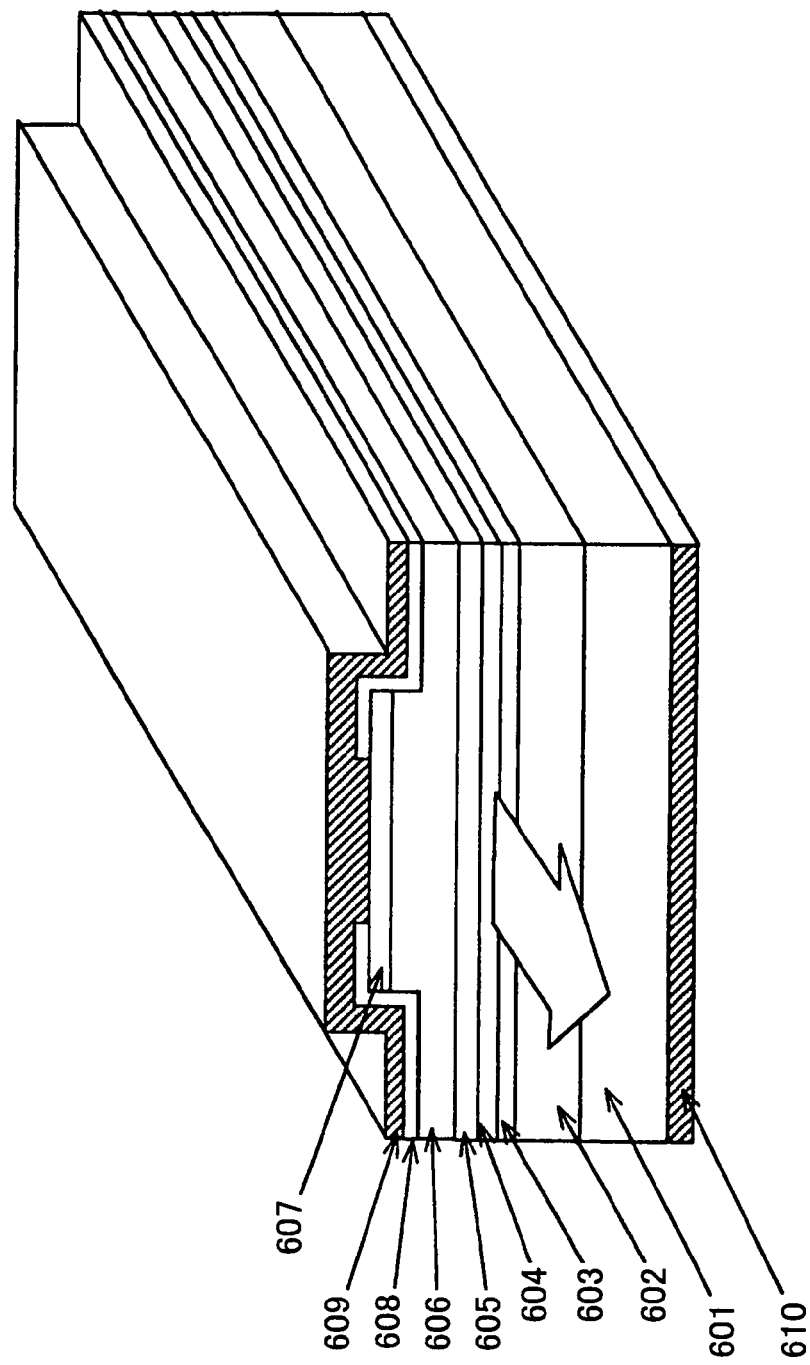
FIG. 25 is a perspective view showing an important part of a first embodiment of a semiconductor device according to the present invention.

FIG. 25 is a perspective view showing an important part of a first embodiment of a semiconductor device according to the present invention. This embodiment of the semiconductor device uses a GaN substrate which is obtained by any of the above described embodiments of the method of growing the group III nitride crystal or the group III nitride crystal growing apparatus. For the sake of convenience, it is assumed that the GaN substrate used is obtained by the group III nitride crystal growing apparatus shown in FIG. 19.

A semiconductor laser shown in FIG. 25 has an n-type GaN substrate 601 which is obtained by the group III nitride crystal growing apparatus shown in FIG. 19. An n-type AlGaN clad layer 602, an n-type GaN guide layer 603, an InGaN Multi-Quantum-Well (MQW) active layer 604, a p-type GaN guide layer 605, a p-type AlGaN clad layer 606 and a p-type GaN contact layer 607 are successively stacked on the n-type GaN substrate 601. The layers on the n-type GaN substrate 601 may be formed by thin film crystal growing techniques such as Metal Organic Vapor Phase Epitaxy (MO-VPE) and Molecular Beam Epitaxy (MBE).

A ridge structure is formed by the stacked layers of GaN, AlGaN and InGaN, and a $SiO_2$ insulator layer 608 has a hole at the p-type GaN contact layer 607. A p-type (Au/Ni) ohmic electrode 609 and an n-type (Al/Ti) ohmic electrode 610 are respectively disposed on top and bottom of the semiconductor laser.

By applying a voltage across the p-type ohmic electrode 609 and the n-type ohmic electrode 610 to supply a current to the semiconductor laser, the semiconductor laser oscillates and emits a laser beam in a direction of an arrow shown in FIG. 25.

The crystal defects within the semiconductor laser are reduced because the crystal defects of the n-type GaN substrate 601 are reduced. Consequently, the semiconductor laser can operate for a long serviceable life to produce a large output. In addition, since the GaN substrate 601 used is the n-type, it is possible to form the ohmic electrode 610 directly on the GaN substrate 601 and to reduce the cost, unlike the conventional insulative substrate such as a sapphire substrate which requires two electrodes to be drawn out from the p and n sides via a group III nitride crystal layer which is grown on the sapphire substrate. Moreover, a light emission end surface of the semiconductor laser can be formed by cleaving, when cleaving the chips, thereby making it possible to realize a high-quality semiconductor laser at a low cost.

In FIG. 25, an InGaN MQW is used as the active layer 604. However, it is possible to use an AlGaN MQW as the active layer 604, so as to shorten the light emission wavelength. In other words, because the crystal defects and impurities in the GaN substrate 601 are small, light emission from a deep level decreases, and a highly efficient semiconductor laser can be realized even when the light emission wavelength is shortened.

Of course, the use of the GaN substrate is not limited to optical devices such as the semiconductor laser, and the GaN substrate is similarly applicable to electronic devices. In other words, by use of the GaN substrate having the reduced crystal defects, GaN-based layers grown epitaxially on the GaN substrate also have reduced crystal defects. As a result, it is possible to realize a high-performance device by suppressing a leak current and improving the carrier trapping effect when the well structure is employed.

Therefore, high-performance devices can be realized by the use of the group III nitride substrate which is obtained by the method or apparatus of growing the group III nitride crystal. In the case of semiconductor lasers and light emitting diodes, "high-performance" includes high output and long serviceable life which could not be realized conventionally. On the other hand, in the case of electronic devices, "high-performance" includes low power consumption, low noise, high-speed operation and operability under high-temperature conditions. Furthermore, in the case of light receiving devices, "high-performance" includes low noise and long serviceable life.

Figure 26:
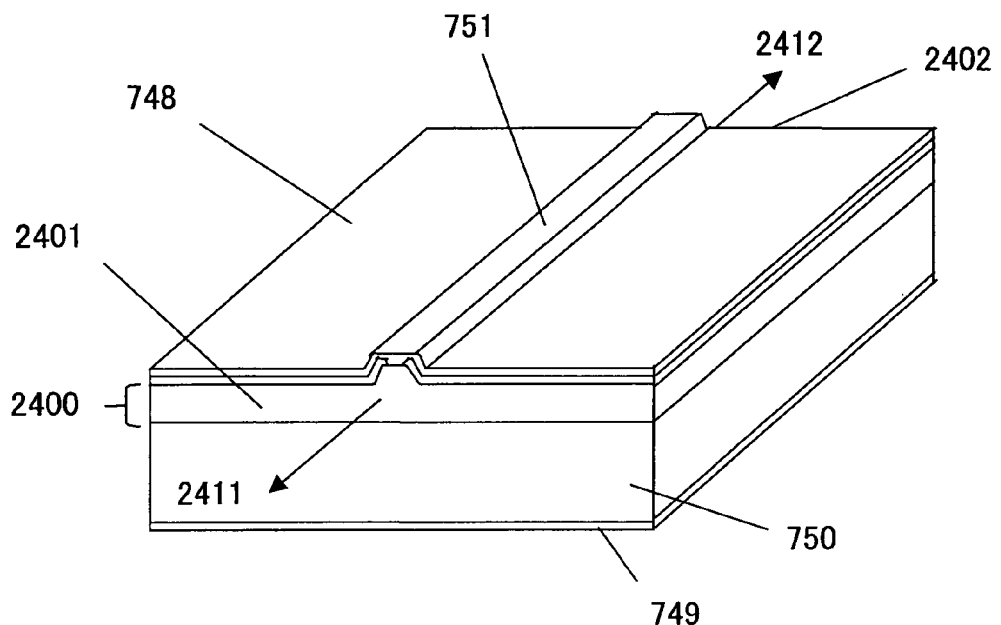
FIG. 26 is a perspective view showing an important part of a second embodiment of the semiconductor device according to the present invention.
Figure 27:
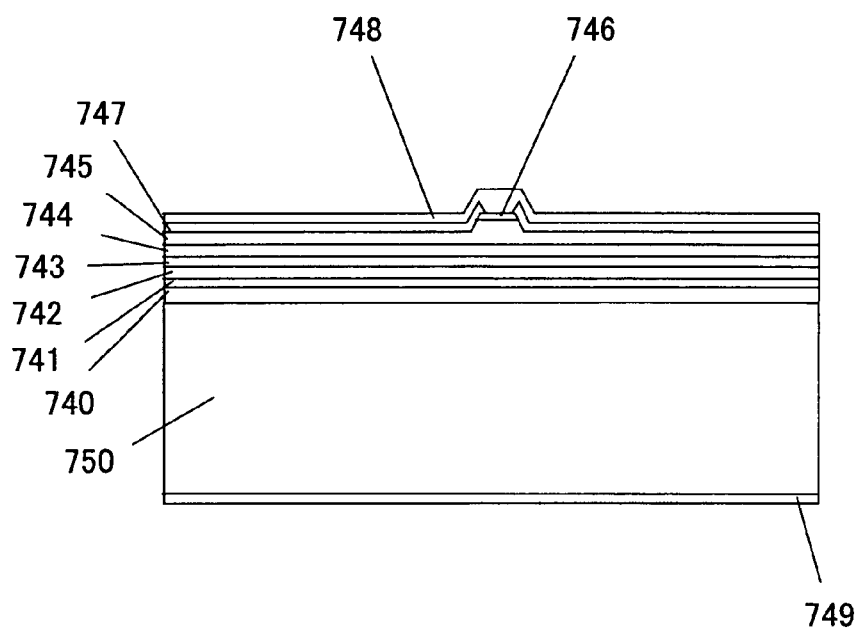
FIG. 27 is a cross sectional view showing an important part of the second embodiment of the semiconductor device.

FIG. 26 is a perspective view showing an important part of a second embodiment of the semiconductor device according to the present invention, and FIG. 27 is a cross sectional view showing an important part of the semiconductor device shown in FIG. 26 cut along a plane perpendicular to a light emitting direction. This embodiment of the semiconductor device uses a GaN substrate which is obtained by any of the above described embodiments of the method of growing the group III nitride crystal or the group III nitride crystal growing apparatus. For the sake of convenience, it is assumed that the GaN substrate used is obtained by the group III nitride crystal growing apparatus shown in FIG. 10.

A semiconductor laser shown in FIGS. 26 and 27 has an n-type GaN substrate 750 which has a thickness of 250 μm and is obtained by the group III nitride crystal growing apparatus shown in FIG. 10. A stacked structure 2400 shown in FIG. 26 includes an n-type GaN layer 740, an n-type $Al_{0.2}Ga_{0.8}$ clad layer 741, an n-type GaN guide layer 742, an $In_{0.05}Ga_{0.95}N/In_{0.15}Ga_{0.85}N$ MQW activation layer 743, a p-type GaN guide layer 744, a p-type $Al_{0.2}Ga_{0.8}N$ clad layer 745 and a p-type GaN cap layer 746 which are successively stacked on the top surface of the n-type GaN substrate 750 by Metal Organic Chemical Vapor Deposition (MOCVD), as shown in FIG. 27.

The stacked structure 2400 is etched from the p-type GaN cap layer 746 to a portion of the p-type $Al_{0.2}Ga_{0.8}N$ clad layer 745 so that a stripe-shaped portion remains, to thereby form a current-narrowing ridge waveguide structure 751. The ridge waveguide structure 751 is formed along the <1-100> direction of the n-type GaN substrate 750, where <1-100> denotes <"1" "1 bar" "0" "0">. A $SiO_2$ insulator layer 747 is formed on the surface of the stacked structure 2400. An opening is formed in the $SiO_2$ insulator layer 747 on a ridge 751.

A p-side ohmic electrode 748 is formed on the surface of the p-type GaN cap layer 746 which is exposed via this opening in the $SiO_2$ insulator layer 747. An n-side ohmic electrode 749 is formed on the bottom surface of the n-type GaN substrate 750. The p-side ohmic electrode 748 and the n-side ohmic electrode 749 may be formed by vapor deposition of Ni/Au and Ti/Al, respectively.

Optical resonator surfaces 2401 and 2402 are formed perpendicularly to the ridge 751 and the $In_{0.05}Ga_{0.95}N/In_{0.15}Ga_{0.85}N$ MQW activation layer 743. The optical resonator surfaces 2401 and 2402 are formed by forming a cleavage of a (1-100) face which is perpendicular to the ridge waveguide structure 751 which extends in the <1-100> direction of the n-type GaN substrate 750. The n-side ohmic electrode 749 and the optical resonator surfaces 1401 and 1402 are formed by polishing the bottom surface of the n-type GaN substrate 750 to a thickness of 80 μm.

By applying a voltage across the p-side ohmic electrode 748 and the n-side ohmic electrode 549, a current flows to inject carriers into the $In_{0.05}Ga_{0.95}N/In_{0.15}Ga_{0.85}N$ MQW activation layer 743. As a result, light emission and light amplification occur, and laser beams 1411 and 1412 are emitted from respective optical resonator surfaces 1401 and 1402, as indicated by arrows in FIG. 26.

The present inventors confirmed that the semiconductor laser has a long serviceable life even when operated to produce a high output, because the crystal defects in the semiconductor laser of this embodiment is small and the crystal quality of the layers formed on the group III nitride substrate is high, compared to the case where the conventional sapphire substrate or, a GaN substrate which is obtained by the conventional technique such as vapor deposition is used for the semiconductor laser.

Figure 28:
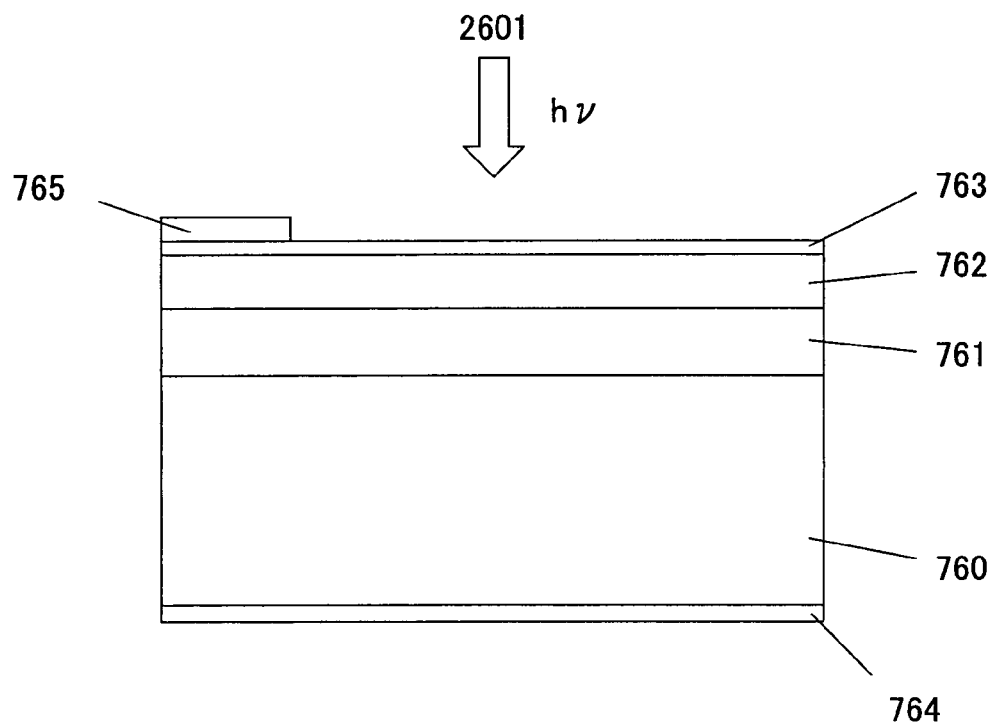
FIG. 28 is a cross sectional view showing an important part of a third embodiment of the semiconductor device according to the present invention.

FIG. 28 is a cross sectional view showing an important part of a third embodiment of the semiconductor device according to the present invention. This embodiment of the semiconductor device uses a GaN substrate which is obtained by any of the above described embodiments of the method of growing the group III nitride crystal or the group III nitride crystal growing apparatus. For the sake of convenience, it is assumed that the GaN substrate used is obtained by the group III nitride crystal growing apparatus shown in FIG. 10.

A light receiving element shown in FIG. 28 has an n-type GaN substrate 760 which has a thickness of 300 μm and is obtained by the group III nitride crystal growing apparatus shown in FIG. 10. An n-type GaN layer 761, an insulative GaN layer 762, and a transparent Schottky electrode 763 made of Ni/Au are stacked on the top surface of the n-type GaN substrate 760, to form a Metal Insulator Semiconductor (MIS) type light receiving element. An ohmic electrode 764 made of Ti/Al is formed on the bottom surface of the n-type GaN substrate 760. Furthermore, an Au electrode 765 is formed on a portion of the transparent Schottky electrode 763.

When light (ultraviolet ray) 2601 is received via the transparent Schottky electrode 763, carriers are generated to cause a photocurrent to flow via the electrodes 765 and 764.

The present inventors confirmed that the light receiving element has a small dark current and a large signal-to-noise ratio (SNR), because the crystal defects in the light receiving element of this embodiment is small and the crystal quality of the layers formed on the group III nitride substrate is high, compared to the case where the conventional sapphire substrate or, a GaN substrate which is obtained by the conventional technique such as vapor deposition is used for the light receiving element.

Figure 29:
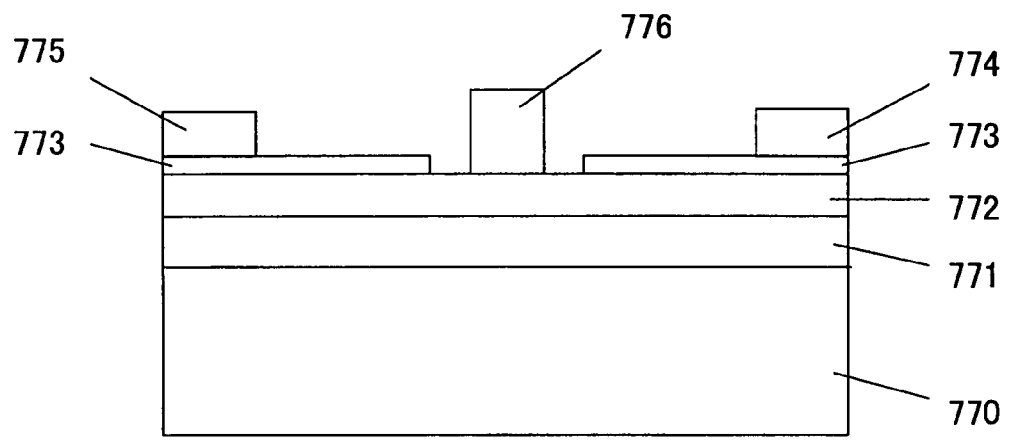
FIG. 29 is a cross sectional view showing an important part of a fourth embodiment of the semiconductor device according to the present invention.

FIG. 29 is a cross sectional view showing an important part of a fourth embodiment of the semiconductor device according to the present invention. This embodiment of the semiconductor device uses a GaN substrate which is obtained by any of the above described embodiments of the method of growing the group III nitride crystal or the group III nitride crystal growing apparatus. For the sake of convenience, it is assumed that the GaN substrate used is obtained by the group III nitride crystal growing apparatus shown in FIG. 10.

A High Electron Mobility Transistor (HEMT) shown in FIG. 29 forms an electronic device having a high-resistance GaN substrate 770 which has a thickness of 300 μm and is obtained by the group III nitride crystal growing apparatus shown in FIG. 10. An insulative GaN layer 771, an n-type AlGaN layer 772, and an n-type GaN layer 773 are stacked on the top surface of the high-resistance GaN substrate 770, so as to form a recess gate type HEMT. A gate portion of the n-type GaN layer 773 is etched to the n-type AlGaN layer 772, and a gate electrode 776 made of Ni/Au is formed on the exposed n-type AlGaN layer 772. A drain electrode 775 made of Ti/Al and a source electrode 774 made of Ti/Al are formed on the n-type GaN layer 773 on respective sides of the gate electrode 776.

The present inventors confirmed that the HEMT has suppressed abnormal diffusion and short-circuiting of the electrode which are caused by crystal defects, high withstand voltage and satisfactory frequency characteristics, because the crystal defects in the HEMT of this embodiment is small and the crystal quality of the layers formed on the group III nitride substrate is high, compared to the case where the conventional sapphire substrate or, a GaN substrate which is obtained by the conventional technique such as vapor phase deposition is used for the HEMT.

Figure 30:
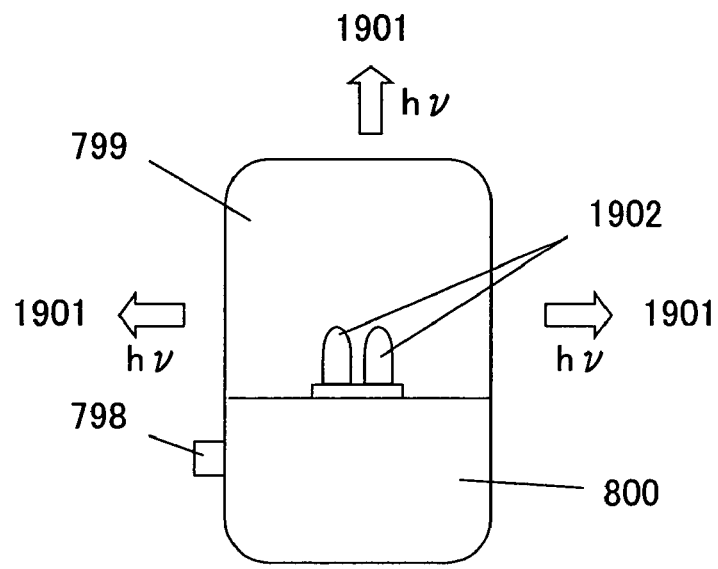
FIG. 30 is a diagram showing an illumination apparatus using a fifth embodiment of the semiconductor device according to the present invention.
Figure 31:
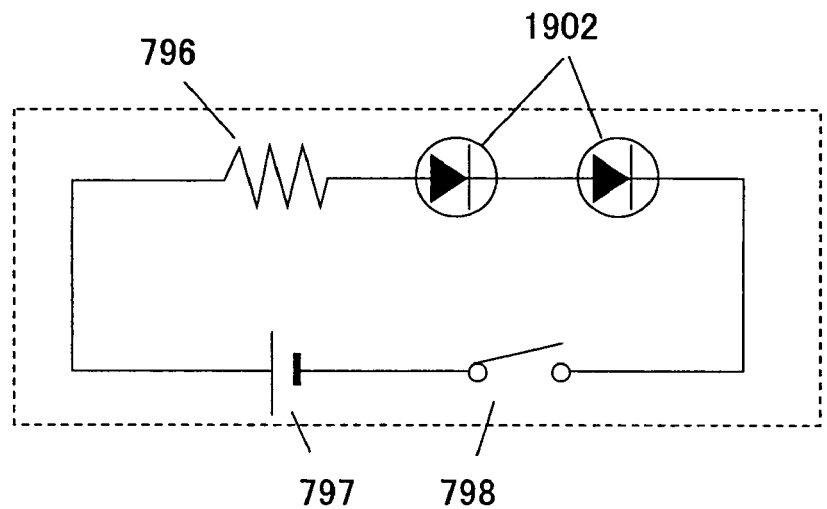
FIG. 31 is a circuit diagram showing the illumination apparatus shown in FIG. 30.
Figure 32:
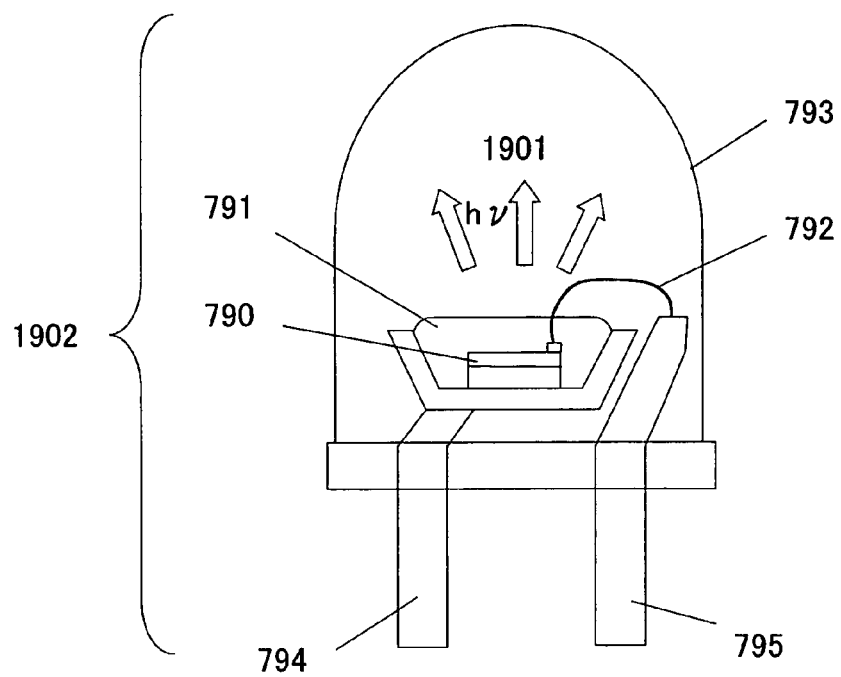
FIG. 32 is a cross sectional view showing a white LED module within the illumination apparatus shown in FIG. 30.

FIG. 30 is a diagram showing an illumination apparatus using a fifth embodiment of the semiconductor device according to the present invention, and FIG. 31 is a circuit diagram showing the illumination apparatus shown in FIG. 30. FIG. 32 is a cross sectional view showing a white LED module within the illumination apparatus shown in FIG. 30, and FIG. 33 is a cross sectional view showing an important part of the fifth embodiment of the semiconductor device within the white LED module.

The illumination apparatus shown in FIGS. 30 and 31 includes two white LED modules 1902, a current limiting resistor 796, a current source 797 and a switch 798 which are connected in series. The white LED modules 1902 are turned ON or OFF by switching the switch 798 to the ON or OFF state.

As shown in FIG. 32, each white LED module 1902 has a YAG fluorescent material 791 coated on an ultraviolet LED 790. When a predetermined voltage is applied across electrode terminals 794 and 795, the ultraviolet LED 790 emits ultraviolet ray which excites the YAG fluorescent material 791 such that white light 1901 is emitted via the YAG fluorescent material 791. The white light 1901 is indicated by arrows in FIGS. 30 and 32.

Figure 33:
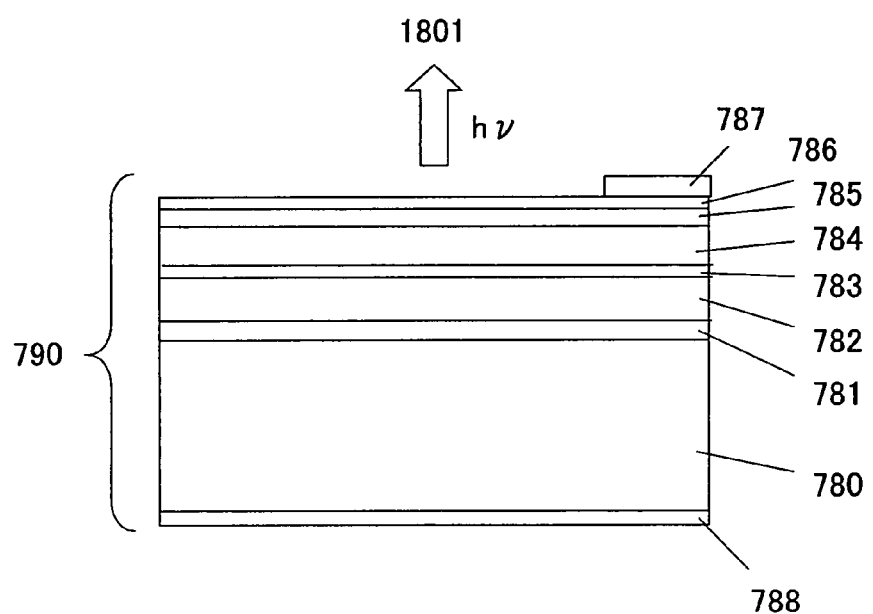
FIG. 33 is a cross sectional view showing an important part of the fifth embodiment of the semiconductor device within the white LED module.

The ultraviolet LED 790 shown in FIG. 33 has an n-type GaN substrate 780 which has a thickness of 300 μm and is obtained by the group III nitride crystal growing apparatus shown in FIG. 10. An n-type GaN layer 781, an n-type $Al_{0.1}Ga_{0.9}N$ layer 782, an activation layer 783 having an InGaN/GaN MQW structure, a p-type $Al_{0.1}Ga_{0.9}N$ layer 784, and a p-type GaN layer 785 are stacked on the top surface of the n-type GaN substrate 780. A transparent ohmic electrode 786 made of Ni/Au is formed on the p-type GaN layer 785. An electrode 787 made f Ni/Au and provided for wire-bonding is formed on the transparent ohmic electrode 786. In addition, an ohmic electrode 788 made of Ti/Al is formed on the bottom surface of the n-type GaN substrate 780.

By applying a voltage across the p-side electrode 787 and the n-side ohmic electrode 788, a current flows to inject carriers into the activation layer 783. As a result, light emission occurs, and ultraviolet ray 1801 is emitted from the ultraviolet LED 790, as indicated by an arrow in FIG. 33.

The present inventors confirmed that the LED has a high light emission efficiency and is capable of producing a high output, because the crystal defects in the LED of this embodiment is small and the crystal quality of the layers formed on the group III nitride substrate is high, compared to the case where the conventional sapphire substrate or, a GaN substrate which is obtained by the conventional technique such as vapor phase deposition is used for the LED.

In addition, it was confirmed that the illumination apparatus using the above LED is brighter but has a low power, compared to the case where the conventional sapphire substrate or, a GaN substrate which is obtained by the conventional technique such as vapor phase deposition is used for the LED of the illumination apparatus.

Therefore, according to the embodiments of the semiconductor device, it is possible to realize high-performance semiconductor devices based on the group III nitride substrate grown by the method or apparatus of the present invention, by providing a light emitting structure, a light receiving structure, a transistor structure and the like on the group III nitride substrate. In this case, the light emitting structure may form a light emitting diode, a laser diode (semiconductor laser) and the like. The light receiving structure may form a photoconductor cell, a pn-junction photodiode, a hetero-junction photodiode, a hetero-junction bipolar phototransistor and the like. The light receiving element may be used for a fire alarm sensor, a wavelength selection type detector and the like. In addition, the transistor structure may form a Field Effect Transistor (FET), a Heterojunction Bipolar Transistor (HBT), HEMT and the like. Of course, other electronic devices may be formed on the group III nitride substrate, such as high-temperature operating devices which operate at high temperatures, high-frequency devices which operate at high frequencies, and electronic devices which produce a large output or operate under a large power.

Further, the present invention is not limited to these embodiments, but various variations and modifications may be made without departing from the scope of the present invention.

What is claimed is:

1. A method of growing a group III nitride crystal, comprising:
dissolving a group III nitride into a solution including an alkaline metal;
recrystallizing the group III nitride into the group III nitride crystal at a location different from a location where the group III nitride is dissolved within the solution; and
independently controlling a temperature at the location where the group III nitride crystal is recrystallized and a temperature at the location where the group III nitride is dissolved within the solution, such that the locations have mutually different temperatures at all times during the dissolving and recrystallizing.

2. The method as claimed in claim 1, wherein the solution contacts nitrogen gas.

3. The method as claimed in claim 1, wherein the group III nitride dissolved into the solution comprises plate-shaped crystals.

4. The method as claimed in claim 1, wherein the group III nitride dissolved into the solution comprises an approximately stoichiometry composition.

5. The method as claimed in claim 1, wherein the group III nitride dissolved into the solution comprises group III nitride crystals which are grown from a solution in which an alkaline metal, a group III metal and nitrogen are dissolved.

6. The method as claimed in claim 1, wherein the group III nitride crystal is grown on a seed crystal.

7. A method of growing a group III nitride crystal, comprising:
forming, within a reaction chamber, a molten mixture of an alkaline metal and a material which includes a group III metal;
growing a group III nitride crystal which is made of the group III metal and nitrogen, from the molten mixture and a material which includes the nitrogen; and
independently controlling a temperature in a vicinity of a surface of the molten mixture and a temperature of a crystal growing region within the molten mixture, so that the nitrogen dissolves into the molten mixture from the surface and the group III nitride crystal grows in the crystal growing region, wherein the crystal growing region is other than the surface.

8. The method as claimed in claim 7, comprising:
filling a space within the reaction chamber with the material which includes the nitrogen, the material which includes the nitrogen being in a gaseous state; and
controlling a pressure within the reaction chamber so that a partial pressure of the material which includes the nitrogen and is in the gaseous state generates no nucleus of the group III nitride in the vicinity of the surface in response to a temperature change at the surface.

9. The method as claimed in claim 7, wherein the temperature in the vicinity of the surface is controlled to a temperature which is higher than the temperature of the crystal growing region.

10. The method as claimed in claim 9, comprising:
setting a seed crystal in the crystal growing region; and
controlling the temperature and a pressure in the crystal growing region, so that the group III nitride crystal grows on the seed crystal.

11. The method as claimed in claim 9, comprising:
controlling the temperature and a pressure in the crystal growing region, so that a columnar group III nitride crystal grows in the crystal growing region.

12. The method as claimed in claim 9, comprising:
controlling the temperature and a pressure in the crystal growing region, so that a plate-shaped group III nitride crystal grows in the crystal growing region.

13. The method as claimed in claim 9, wherein the crystal growing region is located in a lower portion of the reaction chamber.

14. The method as claimed in claim 7, wherein the temperature in the vicinity of the surface and the temperature of the crystal growing region are controlled to approximately same temperature.

15. The method as claimed in claim 7, wherein the temperature in the vicinity of the surface is controlled to a temperature which is lower than a temperature at a lower portion of the molten mixture within the reaction chamber.

* * * * *